United States Patent [19]

Herbert et al.

[11] Patent Number: 4,978,906
[45] Date of Patent: Dec. 18, 1990

[54] PICTURE FRAME MATRIX TRANSFORMER

[75] Inventors: Edward Herbert, Canton; Stephen E. Cebry, Burlington, both of Conn.

[73] Assignee: FMTT, Inc., Canton, Conn.

[21] Appl. No.: 330,199

[22] Filed: Mar. 29, 1989

[51] Int. Cl.[5] .............................................. H01F 31/00
[52] U.S. Cl. .................................. 323/361; 336/175; 363/126
[58] Field of Search ................... 336/175; 363/24-26, 363/126; 323/355, 361, 362; 361/416, 417

[56] References Cited

U.S. PATENT DOCUMENTS

| | | | |
|---|---|---|---|
| 2,600,057 | 6/1952 | Kerns | 336/175 |
| 2,672,584 | 3/1954 | Rolf | 336/175 |
| 3,105,945 | 10/1963 | McCutcheon et al. | 336/175 |
| 4,665,357 | 5/1987 | Herbert | 323/361 |
| 4,684,882 | 8/1987 | Blain | 336/175 |
| 4,845,606 | 7/1989 | Herbert | 363/24 |

Primary Examiner—William H. Beha, Jr.
Attorney, Agent, or Firm—McCormick, Paulding & Huber

[57] ABSTRACT

A picture frame matrix transformer includes a plurality of interdependent magnetic elements arranged end-to-end in a closed pattern configuration and interwired as a matrix transformer having at least one primary and at least secondary windings wherein the end of the winding begins at one end-to-end position between adjacent magnetic elements and ends at another end-to-end position between adjacent magnetic elements. The magnetic elements further comprise N core segments which are interwired with the primary and secondary windings to provide a matrix transformer having both interger and non-interger transformation ratios. Also disclosed is a picture frame matrix transformer configured as an inductor.

17 Claims, 22 Drawing Sheets

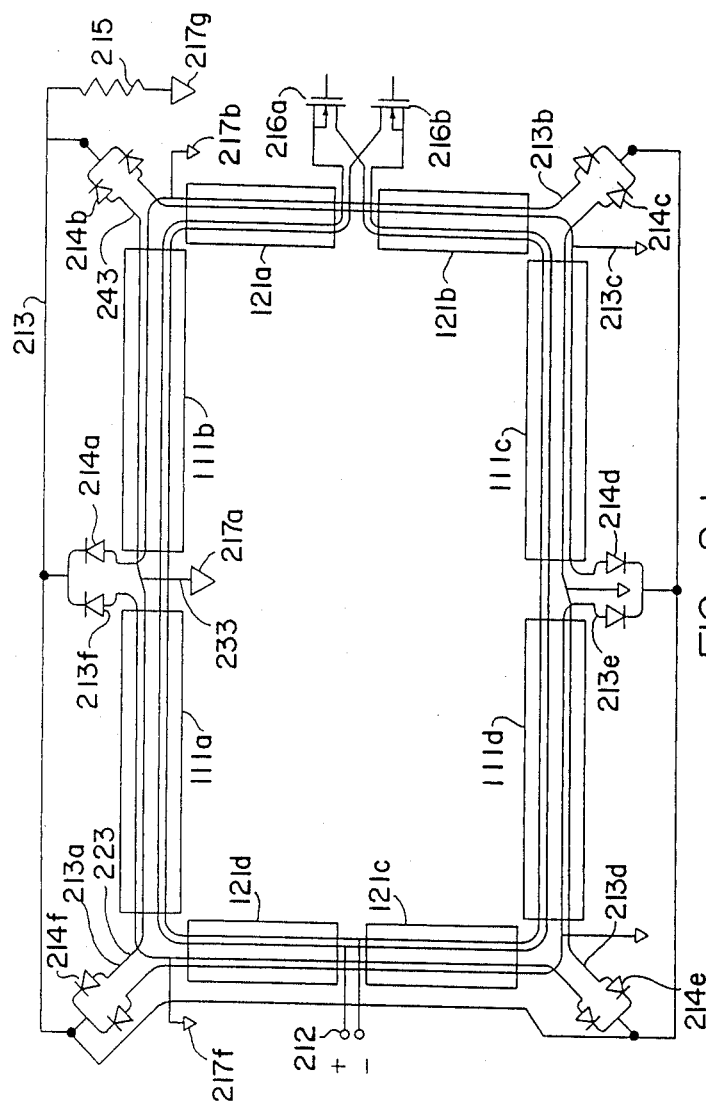
FIG. 2.1

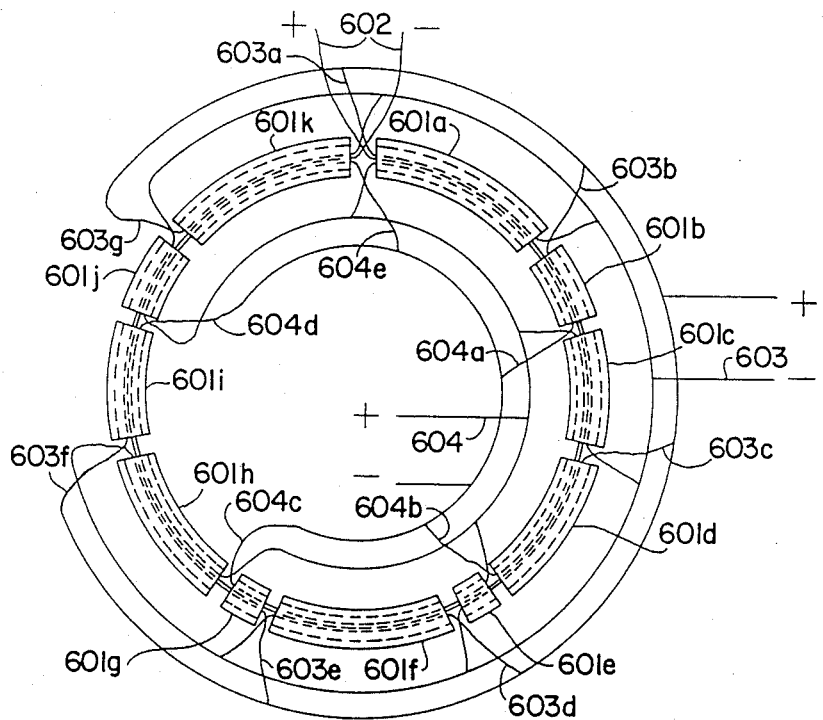
FIG. 6
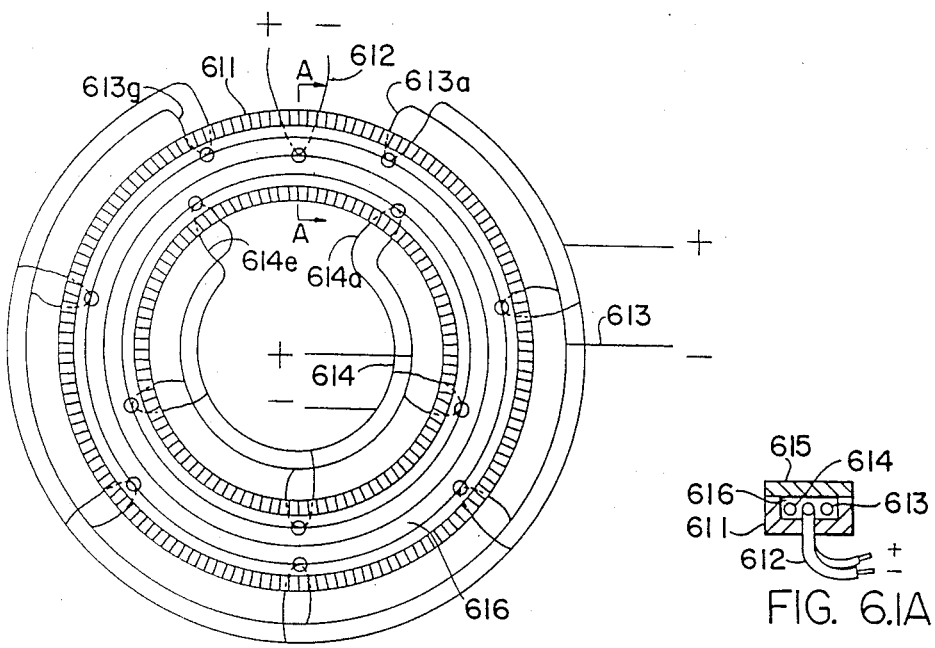
FIG. 6.1
FIG. 6.1A

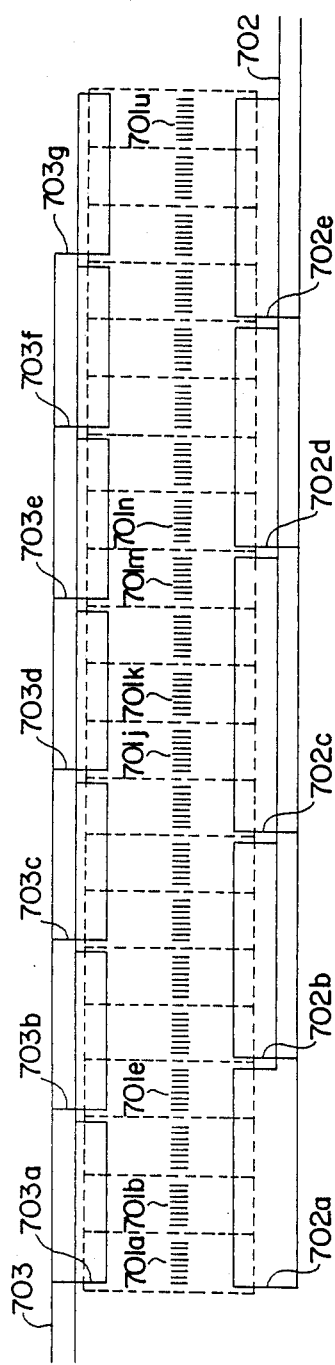
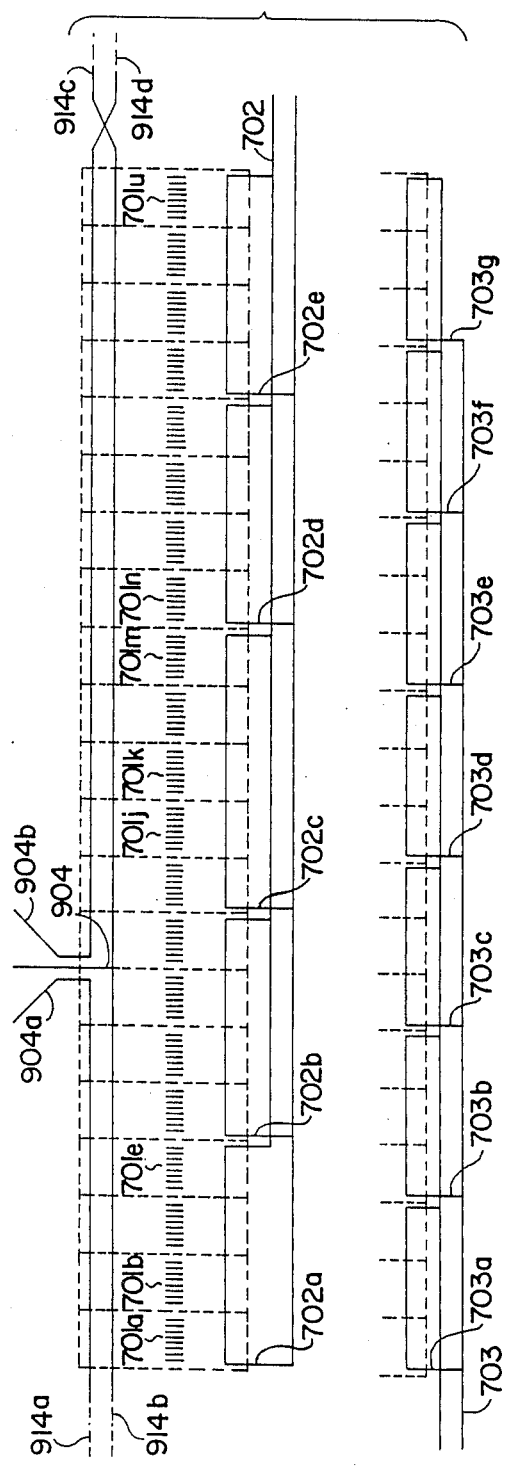
FIG. 8
FIG. 9

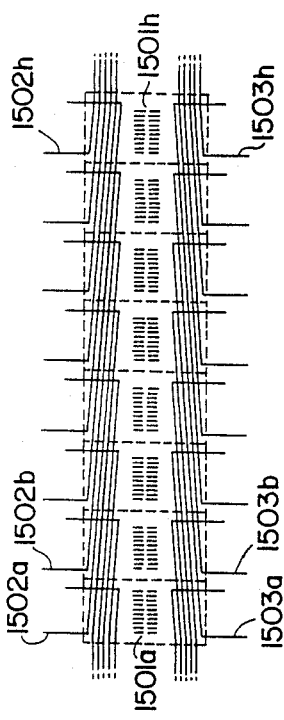
FIG. 15
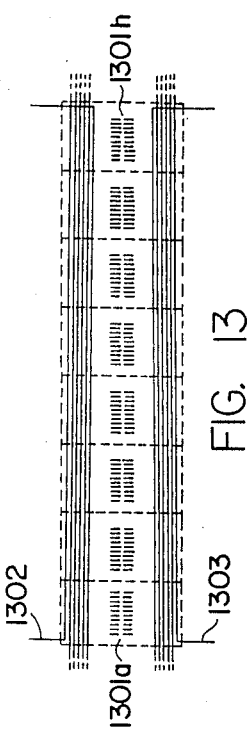
FIG. 13
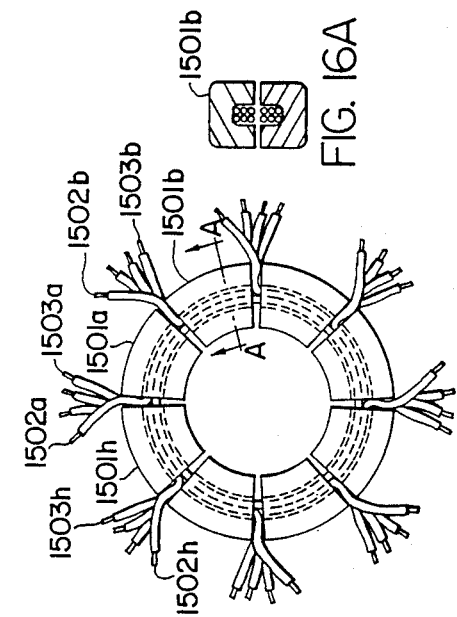
FIG. 16A
FIG. 16
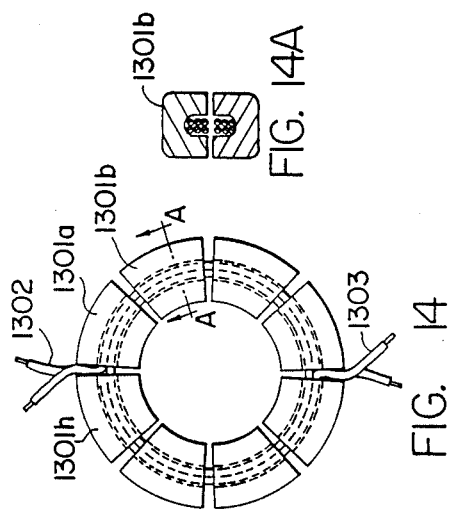
FIG. 14A
FIG. 14

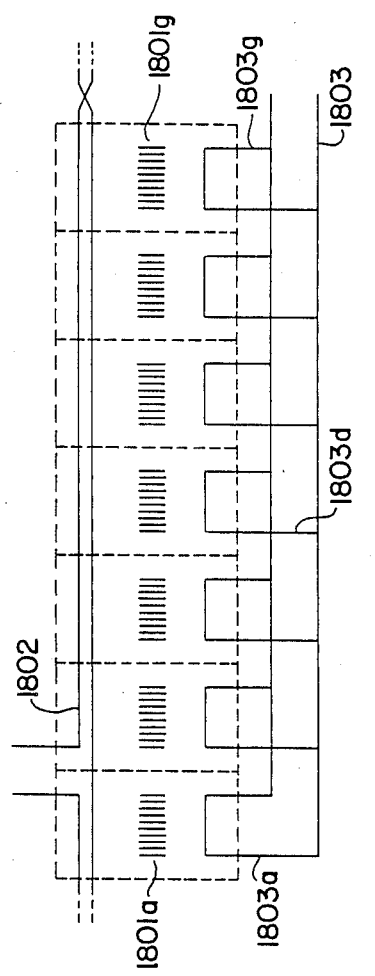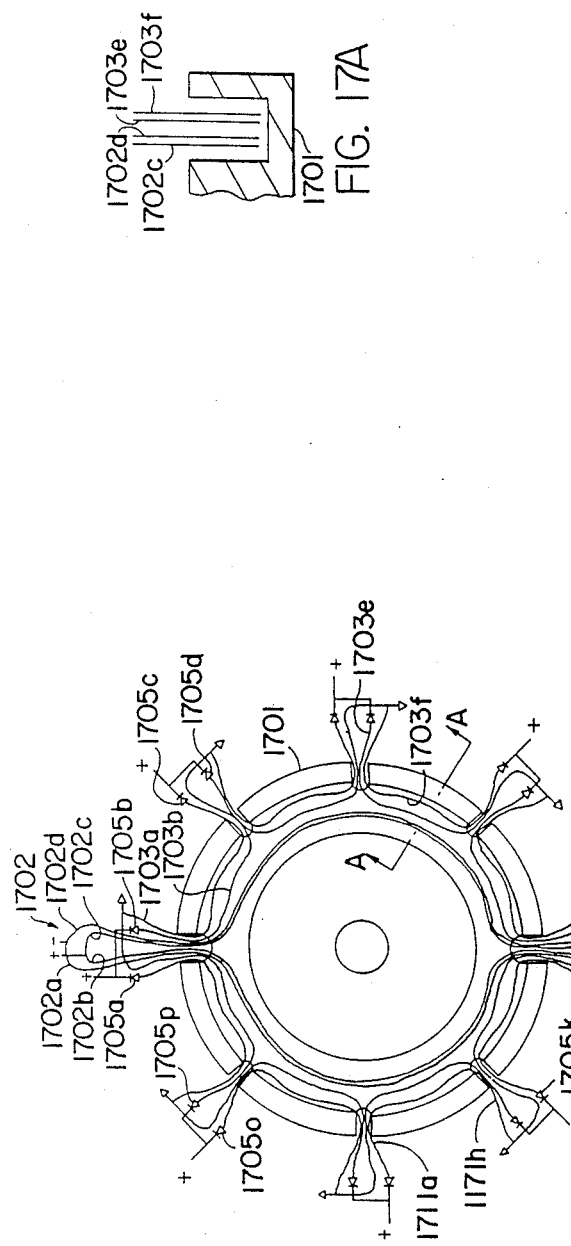

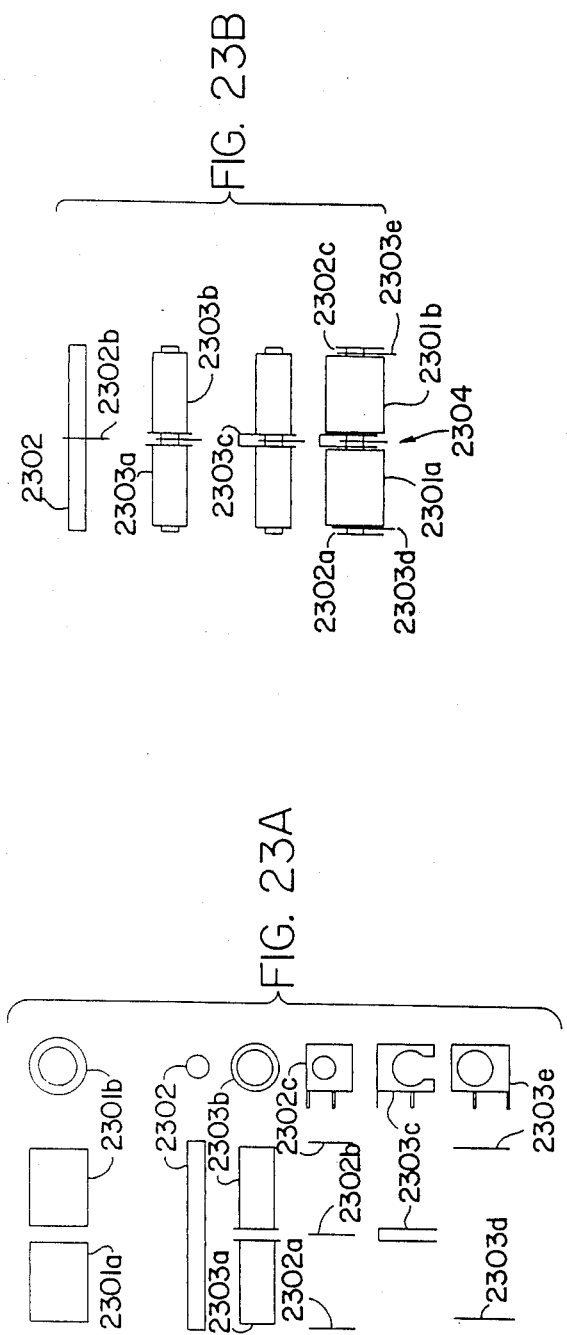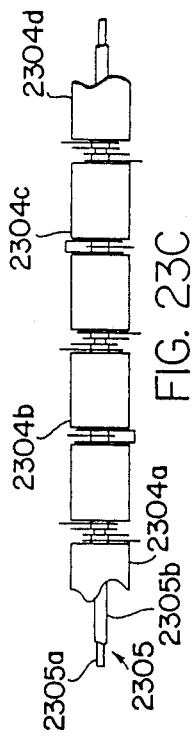

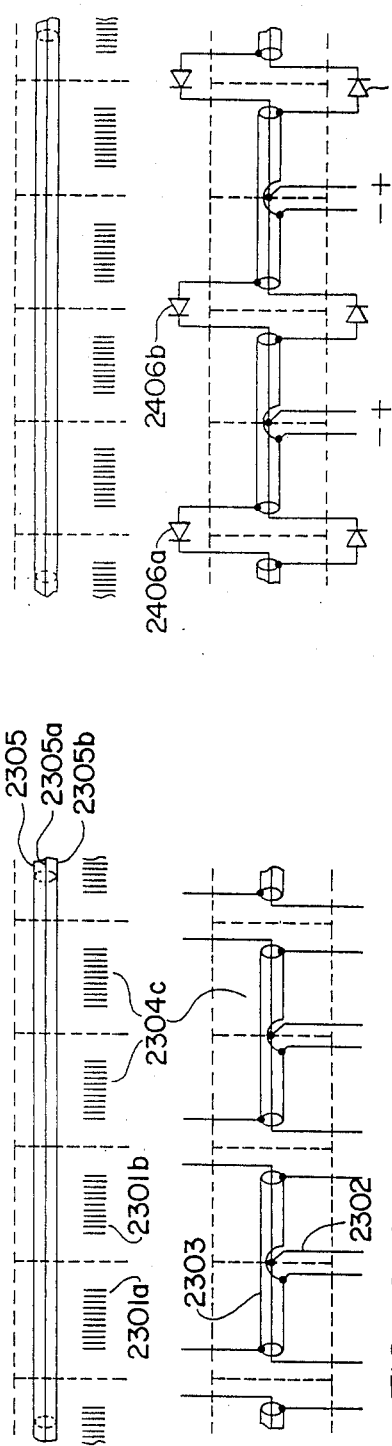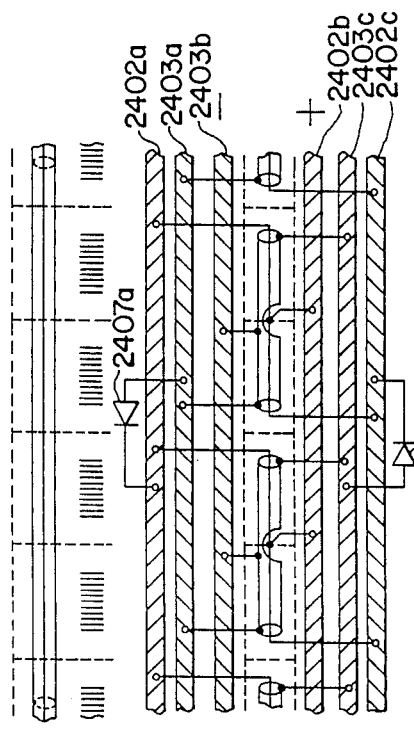
FIG. 24A
FIG. 24B
FIG. 24C

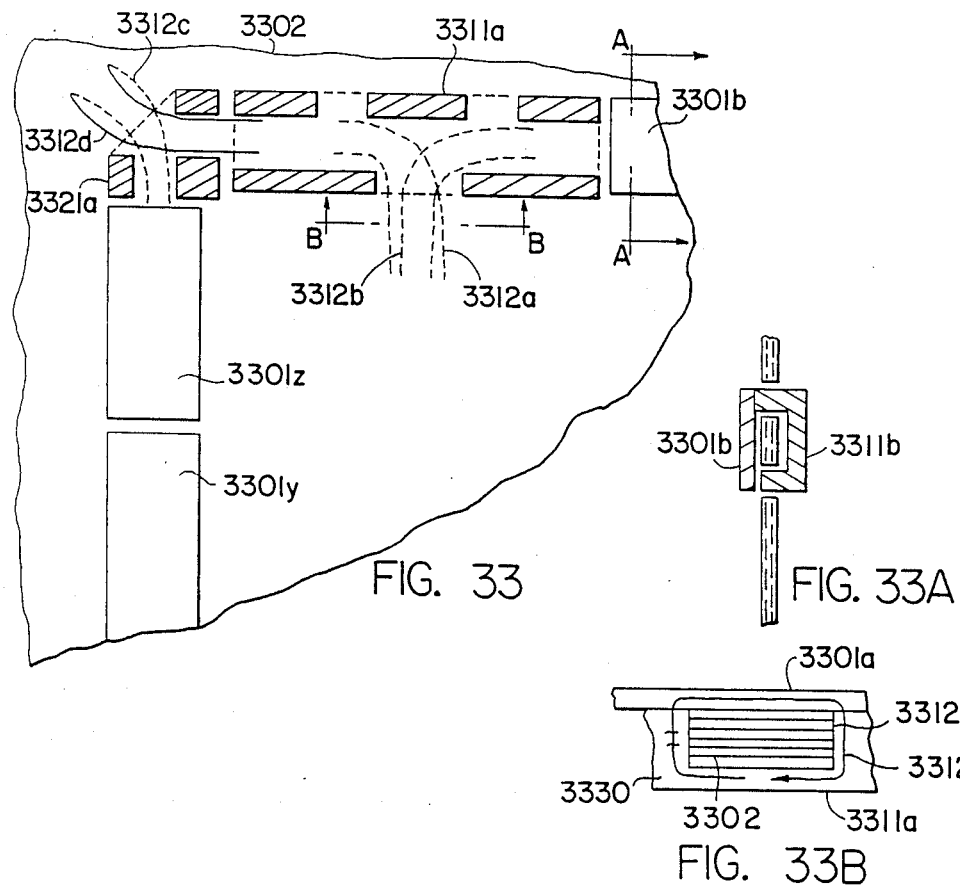
FIG. 33
FIG. 33A
FIG. 33B
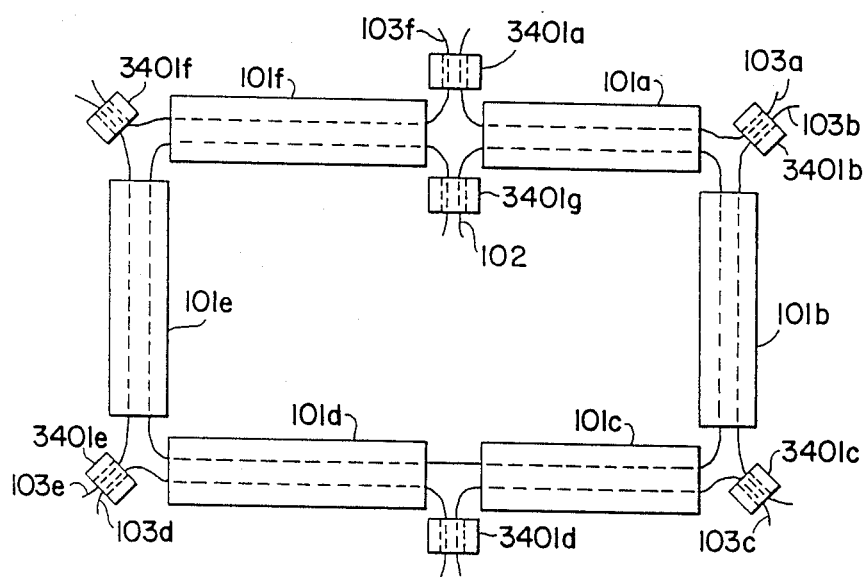
FIG. 34

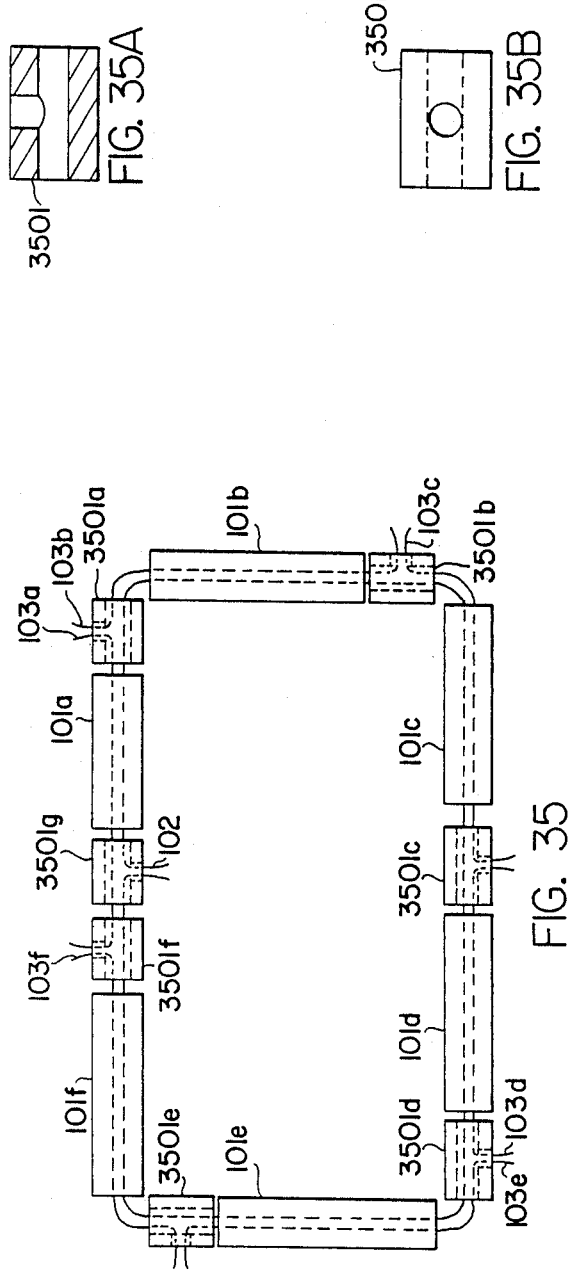

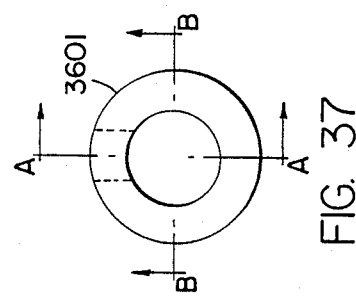
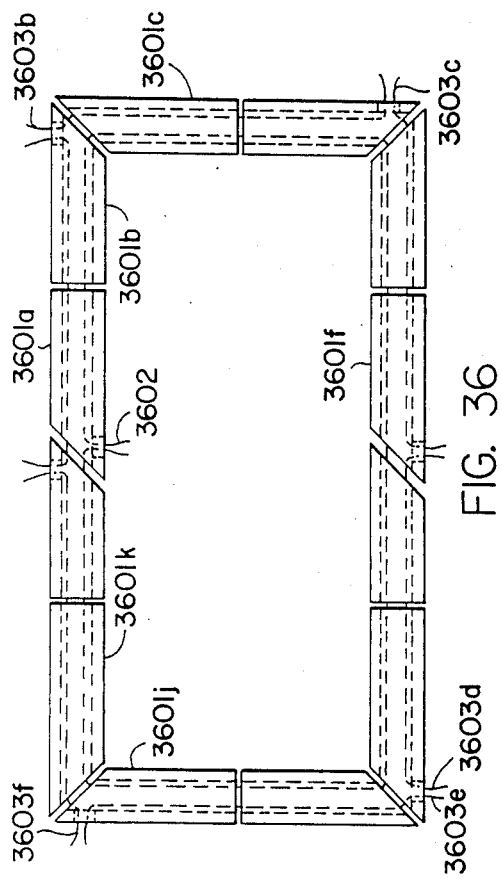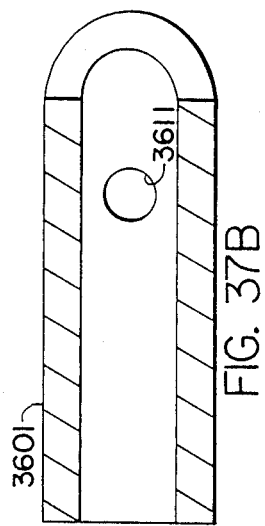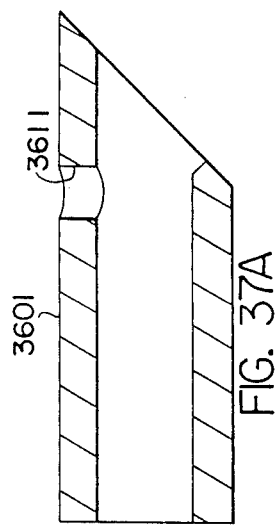

PICTURE FRAME MATRIX TRANSFORMER

BACKGROUND OF THE INVENTION

This invention relates generally to transformers in inductors, and in particularly to matrix transformers and inductors.

The art of transformers and inductors of monolithic construction is well known.

U.S. Pat. No. 4,665,357 "Flat Matrix Transformers" teaches the art of matrix transformers and inductors. A matrix transformer is made of a PluralitY of interdependent magnetic circuits, arranged in matrix, between and among which electrical conductors are interwired, the whole cooperating to behave as a transformer. The matrix transformer has several advantageous features, among them compact size, good heat dissipation and high current capability. A matrix transformer can be very flat indeed, nearly planar, and can be built using printed circuit board techniques. A matrix transformer can insure current sharing between parallel power sources, and/or between parallel loads.

U.S. Pat. No. 4,845,606 "High Frequency Matrix Transformer", issued July 4, 1989, teaches an embodiment of a matrix transformer having features which are advantageous for operation at high frequencies.

U.S. Pat. application Ser. No. 07/220,532 "Transformer having Symmetrical Push-Pull Windings", filed July 18, 1988, teaches an embodiment of transformers having symmetrical push-pull windings, and in particular, teaches an embodiment of the matrix transformer having symmetrical push-pull windings.

SUMMARY OF THE INVENTION

It is the object of the invention to teach an embodiment of the matrix transformer having a novel physical arrangement having a plurality of elements (or other equivalent structure) placed end to end in a closed pattern. The windings of the transformer leave and enter the structure at various points around the closed pattern. The whole has the characteristics of a matrix transformer.

It is a further objective of this invention to teach an embodiment of a matrix inductor comprising a plurality of elements (or other equivalent structure) placed end for end in a closed pattern. The windings of the inductor leave and enter the structure at various points around the closed pattern. The whole has the characteristics of a matrix inductor.

It is a further objective of this invention to teach embodiments of transformers and inductors well adapted to distributed PhYsical Placement for improved heat transfer, and in particular, to teach embodiments in which the transformer and inductor and associated power semiconductors can be distributed and peripherally located for improved heat rejection to the surrounding ambient.

BRIEF DESCRIPTION OF THE DRAWINGS

FIG. 2.1 shows a simple picture frame transformer having a symmetrical push-pull primary winding, and push-pull secondary windings.

FIGS. 3, 4, 5A, 5B, 6, 6.1, 6.1A through 7 show various round picture frame transformers, for tutorial purpose. FIG. 6.1 shows an equivalent structure using a pot core like structure.

FIG. 8 introduces a new schematic notation, using the transformer of FIG. 7 as an example.

FIG. 9 is a schematic of a picture frame matrix transformer having a sing]e turn push pull primary, and two secondaries of different ratio.

FIG. 13 is a schematic of an inductor.

FIGS. 14 and 14A are diagrams of the inductor of FIG. 13.

FIG. 15 a schematic of a picture frame matrix inductor.

FIGS. 16 and 16A are diagrams of the inductor of FIG. 15.

FIGS. 17 and 17A show an "open diagram" of a picture frame matrix transformer using a modified pot core, with rectifiers and switching FET's.

FIG. 18 is a schematic of a picture frame matrix transformer having a two turn primary circuit.

FIG. 23A shows the parts for a coaxial secondary picture frame matrix transformer element assembly. FIG. 23B shows a progressively assembled assembly, and FIG. 23C shows a portion of a picture frame matrix transformer using same.

FIG. 24A–C show partial schematic examples of transformers using the assembly of FIG. 23.

FIG. 30 shows another picture frame matrix transformer with a picture frame inductor with its switching FET's and rectifiers as they might be assembled on a printed circuit card.

FIGS. 32 and 32A show a core structure which could be used both for a transformer and an inductor.

FIGS. 32.1 and 32.1A shows another embodiment of a core structure which could be used both for a transformer and an inductor.

FIGS. 33, 33A and 33B show a core structure suitable for use in a printed circuit board.

FIG. 34 shows the transformer of FIG. 1 with the addition of seven toroids.

FIG. 35, 35A and 34B shows the transformer of FIG. 1, with the addition of seven special cores.

FIG. 36 shows a picture frame transformer using special cores.

FIGS. 37, 37A and 37B show the detail of the special core used in FIG. 36.

DESCRIPTION OF PREFERRED EMBODIMENTS

Figure 1:
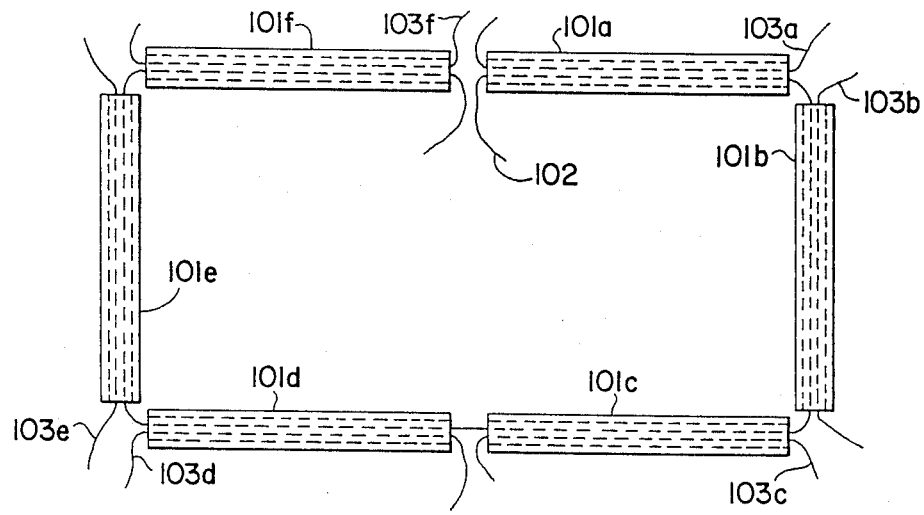
FIG. 1 shows a simple picture frame transformer.

FIG. 1 shows a basic picture frame transformer having six cores 101a-f, a primary Winding 102 linking all of the cores 101a-f having a single series turn, and a secondary winding comprising six secondary winding sections 103a-f, each one linking one of the cores.

In the jargon of matrix transformers, of which this is a novel embodiment, each of the cores 101a-f, with the secondary section and the segment of the primary 102 which couples it is defined as an "element" of the picture frame transformer. The usual way to use a matrix transformer is to tie all of the secondary sections 103a-f together in parallel, observing polarity. If this were done, the transformer of FIG. 1 would have an effective turns ratio of 1 to 6.

Because the windings of a matrix transformer are often single wires passing through elements, "turns" and "turns ratio" are misnomers, but they are accepted jargon in the art of transformers, so their use is retained. Also "winding" is used generically to identify a conductive path through one or more elements, whatever its composition or physical embodiment, and Would include wires, bus bars, tubes, coaxial sheaths, printed wiring board or flex print traces or whatever, and can be any type of winding, center tapped, split, bi-filar, coaxial or multiple turn variations of those listed.

"Core" is also used generically to identify a structure, or portion of a structure having a closed magnetic path. Included Would be toroids; sleeves; pot cores; cross cores, or, depending on the context, one arm of a cross core; various lamination structures including, but not limited to U, U-1, D-U, E-E, E-1, F-F, C or L laminations; special magnetic structures such as a block having grooves therein to receive windings, or a plate with a plurality of posts thereon, or a plate with a plurality of holes therein. Also included Would be gapped cores, or cores having a special structure such as the cross cores used in constant current transformers or their equivalents. The foregoing are given as examples and not as limitations.

For additional details related to the construction of matrix transformers, reference may be made to the above identified U.S. Pat. No. 4,665,357 entitled entitled "High Frequency Matrix Transformer", both of which are assigned to the same assignee as the present invention and both of which are incorporated herein by reference.

Figure 2:
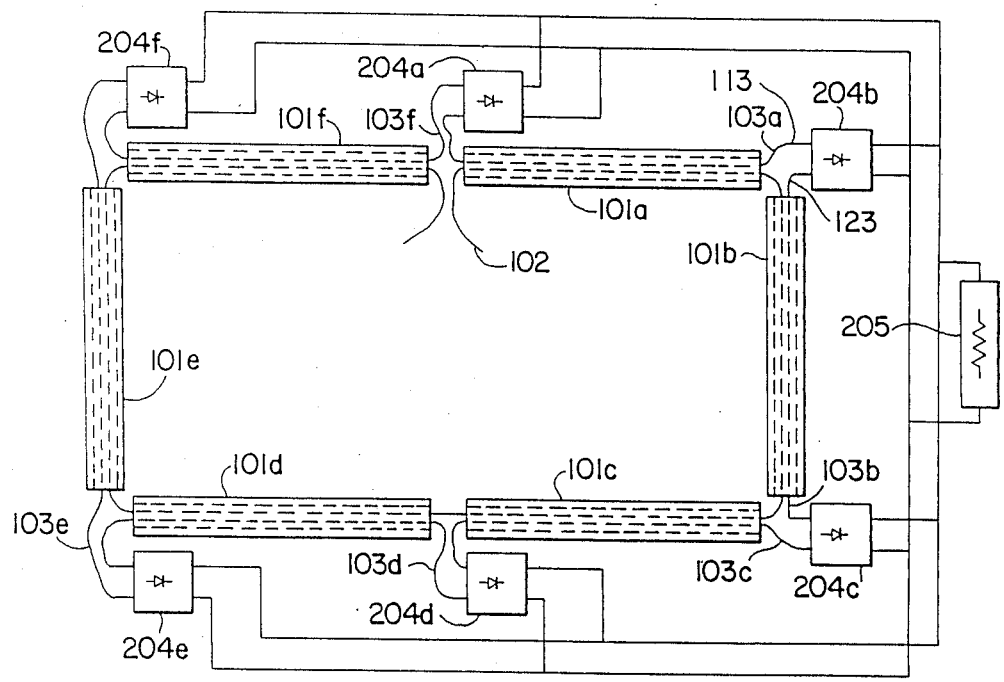
FIG. 2 shows the transformer of FIG. 1 with full wave bridge rectifiers on its secondaries.
Figure 3:
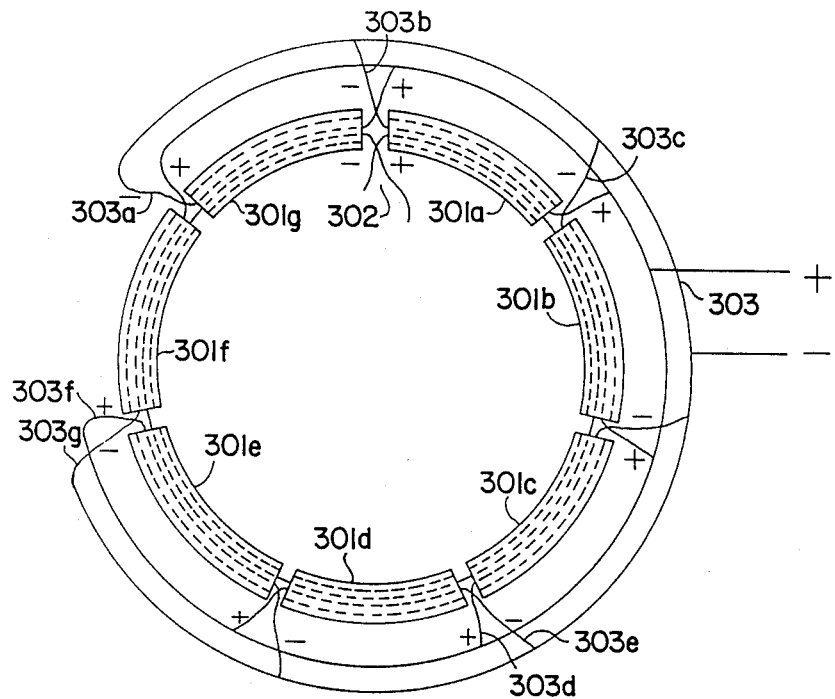

FIG. 2 shows the transformer of FIG. 1 with the addition of full wave rectifiers 204a-f, and a load shown as a resistor 205, by Way of example but not as a limitation. The outputs of the full Wave rectifiers 204a-g are connected in parallel, observing polarity, and taken to the load 205. (For some applications, it would be preferred to have a loW-pass filter netWork associated with each of the full Wave rectifiers 204a-f). As is the nature of matrix transformers, the current in each of the full wave rectifiers 204a-f is equal, and each current equals the current in the primary winding 102 (neglecting magnetization currents).

The transformer of FIG. 2 is preferably made of long, slender cores 101a-f, as is shown pictorially. For good characteristics at high frequency, it is preferred that the cores 101a-f be placed close together, end-to-end, and the uncoupled wiring be kept to a minimum.

Note in particular the interconnection of the secondary windings 103a-f to the full wave rectifiers 204a-f. The two ends of each secondary winding 204a-f are not brought to the same full wave rectifier. (Although this would work schematically, the extra uncoupled wiring which would be needed to return along the length of the long, slender cores 101a-f would be detrimental to high frequency operation). Instead, the two wires exiting the transformer at each place where the elements adjoin are rectified, even though they are from different secondary windings. For example, the "end" 113 of a first secondary winding 103a and the "start" 123 of a second secondary winding 103b are taken to a full wave rectifier 204b. This wiring pattern is repeated around the transformer.

This wiring pattern is one of the distinctions between the transformer of the present invention and prior art transformer circuits using multiple transformers with series primaries and parallel secondaries.

FIG. 2.1 shows a picture frame transformer which is similar to the transformer of FIG. 2, but having push-pull windings. In general any winding represented as a single wire can be replaced with a push-pull winding having two wires which are alternatively energized to provide the alternating excitation (primary), or which have push-pull rectification or demodulation (secondary).

Four longer cores 111a-d and four shorter cores 121a-d can be used. A push-pull primary 212 couples all of the cores 111a-d and 121a-d, and is shown with switching FET's 216a,b. The primary 212 shown is a symmetrically divided push-pull winding, also known as a "symmetrical push pull winding".

For additional details related to the construction of matrix transformers having symmetrical push-pull windings, reference may be made to U.S. Pat. application No. 07/220,532 entitled "Transformer having Symmetrical Push-Pull Windings", filed July 18, 1988 and assigned to the same assignee as the present invention, the disclosure of Which is hereby incorporated by reference.

Full Wave rectification is provided by six rectifier assemblies 214a-f, shown as common anode dual rectifiers. A secondary winding 213 comprises six pushpull secondary segments 213a-f, and a bus structure paralleling the common anode outputs of the rectifier assemblies 214a-f. A load is shown as a resistor 215. The common returns 217a-g are also part of the secondary 213, and are understood to be part of the bus structure.

Note that each of the push-pull secondary segments 213a-f has a common ground 217a-f located in close proximity with the output of each of the rectifying assemblies 214a-f. This is preferred for high frequency operation to minimize the effects of lead inductance. Note, though, that the two halves of the push-pull winding segments 213a-f pass in opposite directions through the adjacent cores 111a-d and 121a-d to the next rectifying assembly 214a-f, and that the inputs to the rectifying assemblies 214a-f are windings 213a-f which have their ground connections 217a-f at the next rectifying assembly 214a-f in each direction around the picture frame transformer.

For example, the start 223 of the secondary winding segment 213a is at the rectifying assembly 214f, and passes through core 111a to the common 233,217a of the winding 213a which is located near the rectifying assembly 214a. The winding 213a then continues through core 111b to its end 243 at the rectifying assembly 214b. The winding pattern is similar for each segment 213a-f of the secondary 213.

To gain a better understanding of the invention, reference is made to FIGS. 3-7 and the following description wherein the principles of operation of the invention are explained without regard for optimum interconnection or configuration. The transformer of FIG. 3 comprises seven core segments 301a-g, a primary winding 302 connecting all of the cores 301a-g, and a secondary winding 303 comprising seven secondary winding sections 303a-g. The secondary winding sections 303a-g are paralleled, observing polarity.

The primary Winding 302 is shown as a single turn linking all of the cores 301a-b. (This is the simplest case to analyze, but is not a limitation. Multiple turns, center tapped or split windings and other variations are all usable). The flux capacity of the cores 301a-g taken together must be sufficient to support the volts-seconds of the primary voltage wave form, according to Faraday's law, as is true with an transformer. This relationship is well known to those skilled in the art.

To develop a step down transformer of ratio 1 to N, consider first an analytical model in which there is one long illustrative core with sufficient flux capacity to support the primary volts-seconds. A core sufficient to support the secondary volts seconds would be 1/N as long, the volts being 1/N, and the waveform being the same. Therefore it is sufficient simply to "cut" the illustrative primary core into N equal segments. The transformer of FIG. 3 has, for example, a ratio of 1 to 7. The illustrative primary core comprises all of the core segments 301a-g envisioned as being joined together. When "cut", the core segments 301a-g result.

Figure 4:
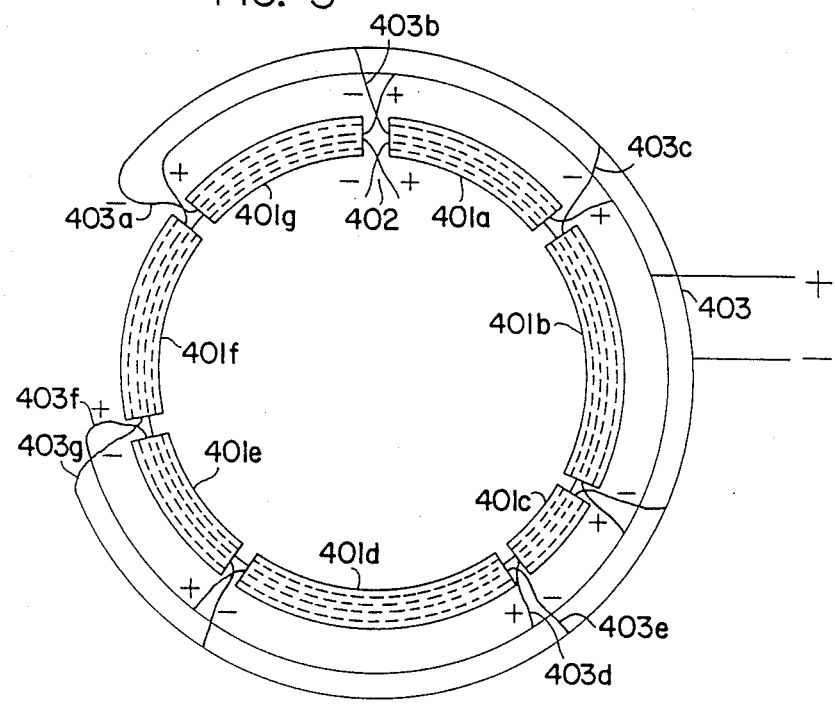
Figure 5:
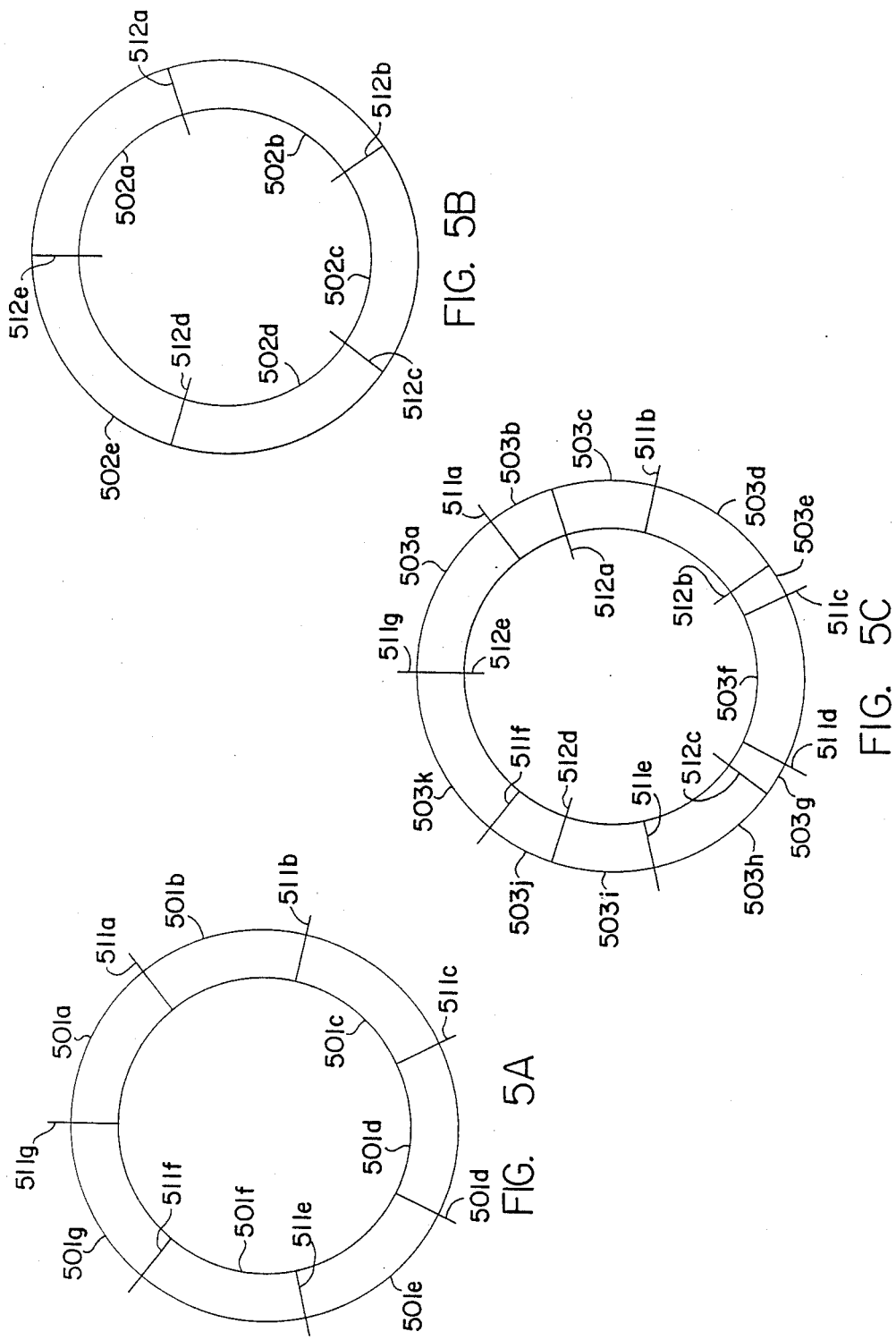

FIG. 4 is also a 1 to 7 transformer. FIG. 4 shows that it is not how the illustrative primary core is divided, but rather the number of secondary windings and how they are connected that determines the ratio. The transformer of FIG. 4 also comprises seven cores 401a-g, with a primary winding 402 and a secondary winding 403 comprising seven secondary winding sections 403a-g which are taken in parallel, observing polarity.

Assuming similar and homogeneous material and a scale approximately as shown, the flux capacity of the seven cores 401a-g are not at all equal. However, because the secondary winding sections 403a-g are paralleled, the voltage of each secondary Winding section is constrained to be equal. Within each element, the volts per turn is equal, so the primary voltage is divided into seven equal parts, thus establishing that the secondary voltage is 1/7th of the primary. Also the sum of the currents (amperereturns) in each element (comprising a core, its secondary winding section and a portion of the primary winding) must be zero, according to Lenz's law. This relationship is well known to those skilled in the art. Therefore the current in each secondary must be equal to the primary current. There being seven secondaries in parallel, each having a current equal to the primary current, establishes that the secondary current is seven times the primary current. Either the voltage or the current relationship establishes that the transformer ratio is 1 to 7. Thus the flux capacity and the physical size of the cores do not enter into the determination of the ratio.

In the transformer of FIG. 4, the cores must be designed such that the flux capacity of the smallest core 401c is sufficient to support the volts-seconds of 1/7th of the primary voltage Wave form. The other cores, being larger, will have excess flux capacity and therefore will operate at lower flux density. From the foregoing it is seen the transformer is optimized when the cores are equal, as in FIG. 3.

It is readily apparent that the techniques described above can be used to design a picture frame matrix transformer of any integer ratio.

FIGS. 5A-C show the development of a core structure for a picture frame matrix transformer having secondaries of different integer ratios. In all three figures, the total core flux capacity is determined by the primary volts-seconds characteristic of the primary voltage wave form, and is assumed to be the same in the three examples represented in FIGS. 5A-C.

In FIG. 5A, the illustrative "primary core" is divided into seven equal parts 501a-g by the cut lines 511a-g which are extended outward and which are further explained in FIG. 5C. The ratio of the transformer of FIG. 5A is 1 to 7.

In FIG. 5B, the illustrative "primary core" is divided into five equal parts 502a-e by the cut lines 512a-e, which are extended inward, and which are further explained in FIG. 5c. The ratio of the transformer of FIG. 5B is 1-5.

In FIG. 5C, the illustrative "primary core" is divided into eleven parts 503a-k, not equal. The resulting structures provides cores to make a transformer having a 1 to 7 secondary as well as a 1 to 5 secondary. The cut lines 511a-g and 512a-e retain their original extension outward and inward, to clearly shoW their derivation.

FIG. 6 shows a transformer built using the cores as determined by the structure used in FIG. 5C. A primary winding 602 makes a single pass through eleven core sections 601a-k. A first secondary 603 comprises seven parallel sections 603a-g, and is wound through the cores 601a-k with terminations at seven equally spaced places. A second secondary winding 604 comprises five parallel sections 604a-e, and is wound through the cores 601a-k with terminations at five equally spaced places. The seven outputs of the first secondary 603 are taken in parallel, observing polarity. The five outputs of the second secondary 604 are similarly taken in parallel, observing polarity.

FIG. 6.1 shows a transformer which is equivalent to the transformer of FIG. 6, however a pot core type structure is used rather than separated cores. The core structure 611 is circular, and has a channel 616 to receive the Windings. A cover 615 completes the magnetic circuit. The core structure 611 has a plurality of holes in it to allow the windings to enter and exit. Slots or notches would be equivalent, and their location could be on the bottom as shoWn, or on the inside, outside or top or some mix thereof.

A primary winding 612 enters the core structure 611 at a first hole, makes one turn (or more) around the core structure through the channel and exits through the same hole. A first secondary 613 comprises seven secondary segments 613a-g taken in parallel, observing polarity. The seven first secondary segments 613a–g enter and exit the core structure 611 through seven holes as shown, the holes being nominally equally spaced circumferentially in the channel. Each of the first secondary segments 613a–g starts in one hole and ends in the next adjacent hole stitchwise around the channel, the last ending where the first started in a closed pattern. The second secondary 614 comprises five secondary segments 614a–e similarly wound in five holes.

Although not essential, it is preferred to use separate holes for the different winding, and to space them apart. There must be no net current difference in the wires passing through any hole. If there is a difference, the closed flux path around the hole will resist it. Thus, this implementation can be seen to be useful for attenuating common mode currents as might result from capacitively coupled noise.

Figure 7:
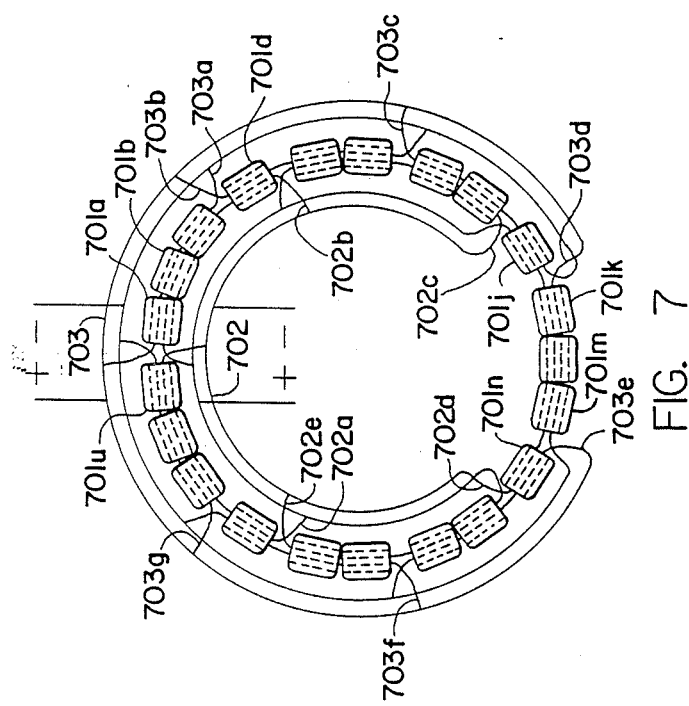

FIG. 7 shows a transformer that is based upon the design of the transformer of FIG. 6, with the following differences to illustrate another embodiment of the picture frame matrix transformer of the present invention.

1. The original primary 602 is not used. The first secondary 603 is now the primary 703 and the second secondary 604 is now the secondary 704. This emphasizes that the labels "primary" and "secondary" are arbitrary and can be interchanged at will. The resulting transformer of FIG. 7 has a 7 to 5 ratio.
2. The cores are now all one standard size using one to three cores between winding exits as needed to approximate the core sizing a determined by the method used to design the transformer of FIG. 6. This may result in a core that may be somewhat larger than optimum.

In the transformer of FIG. 7, twenty one cores 701a–u are used, and are located essentially end-for-end in a closed path. A primary winding 703 comprising 7 parallel sections 703a–g is wound on the cores 701a–u, each winding coupling three of the cores 701a–u. A secondary winding 702 comprising five parallel sections 702a–e is also wound on the cores 701a–u winding each nominally coupling four cores. One secondary section 702d couples five cores 701j–n.

The flux density in each core should be determined to be sure that none is over stressed. (If the flux density in any of the cores 701a–u is particularly low, a smaller core could be used if it Were worth while to do so). To calculate the flux density in any core, Faraday's law is used. The waveform is common throughout but the voltage supported by the flux in each core will differ.

To determine the voltage supported by the flux in any section, one can define an illustrative winding making one turn through all of the cores starting and ending at any convenient point. For this example, the winding begins with the first core 701a at the end where it meets the 21st core 701u. (This is also a point where both the primary 703 and the secondary 702 have terminations, which is convenient, though it is not a necessary condition). We then must define the total voltage in the illustrative winding. This can be seen to be seven times the primary voltage and five times the secondary voltage.

The voltage at each termination of either winding is constrained because it is part of a parallel circuit. The voltage rise in the illustrative single turn between any two points where terminations occur must be the same as the voltage dIfference constrained by the external circuit. Thus going around the primary, the voltage in the illustrative winding at points where the primary 703 has a termination will he 0, $V_p$, $2V_p$, $3V_P$, $4V_p$, $5V_p$, $6V_p$ and $7V_P$, where $V_p$ is defined as the primary voltage.

Similarly, going around the secondary 702, the voltage in the illustrative winding at points where the secondary 702 has terminations Will be 0, $V_S$, $2V_S$, $3V_S$, $4V_S$ and $5V_S$, where $V_S$ is defined as the secondary voltage. The next step is to calculate the voltage at each point on the illustrative winding where terminations of either winding occur, (noting that $V_S$ equals 7/5th of $V_P$), and rank them. It is preferred that:

1. Going around the illustrative winding, the voltage should increase at successive points where terminations of any winding exit the transformer.
2. Using the voltage difference from point to point, and knowing the Wave form and the core characteristics, calculate the flux density using Faraday's law. Make sure that it is Within acceptable limits for every core.
3. No terminations on different windings should be located at the same exit point unless the voltage as determined above are identically equal.

Even if the voltages are equal, it is preferred to shift one Winding relative to the other to eliminate any condition where more than òne exit points of different windings are located together. To illustrate this by example, consider a transformer having a five segment winding and a ten segment Winding. This could be wound having five exit points at which both windings have terminations. It is preferred to shift the relative position of the Windings so that no more than one exit point of different windings are located together. In the example, shifting the relative position of the windings results in none of the exit points of either Winding being located with the exit points of the other.

FIGS. 6 and 7 represent rather simple embodiments of the picture frame matrix transformer, yet the figures are hard to follow. This suggests the need for a diagrammatic representation which can be related to the physical picture frame matrix transformer, but which allows the windings to be exPanded for clarity. FIG. 8 shows such a diagrammatic representation of the transformer of FIG. 7 wherein 21 cores 701a–u are shown in a row. It is to be understood that these are the same cores 701a–u as represented in FIG. 7, and it is further to be understood that the cores 701a–u would be arranged physically in a closed pattern with the last core 701u closing upon the first core 701a. Extending perpendicularly between the cores 701a–u are vertical dashed lines, demarking the circuits coupled by each of the cores 701a–u. In this manner, the primary winding 703 comprising paralleled segments 703a–g and the secondary winding 702 comprising paralleled segments 702a–e are defined.

FIG. 9 shows a schematic of a picture frame matrix transformer having 21 cores 701a–u which are the same cores used in the transformers of FIGS. 7 and 8 above. A first secondary 702 comprises 5 segments 702a–e. The perpendicular dashed lines are interrupted by a horizontal dashed line, which is to be understood to be the external interface of the winding represented within it. The vertical dashed lines are then continued, demarking the section of the next winding which is also coupled by the same core. A second secondary 703 comprises 7 segments 703a–g. A primary winding 904 is a center tapped winding comprising two halves 904a,b.

Note that the dashed lines extending left 914a,b and right 914c,d are part of the primary winding 904 and are to be understood to be connected, 914a to 914c and 914b to 914d. This schematic depiction is to be understood to represent a transformer which is physically arranged in a closed pattern such that core 701u is physically adjacent to core 701a and there is minimal gap between them or between any other adjacent cores. The pictorial diagram of FIG. 7 would be a suitable representation of the transformer of FIG. 9 if the primary winding 904 were added.

Figure 10:
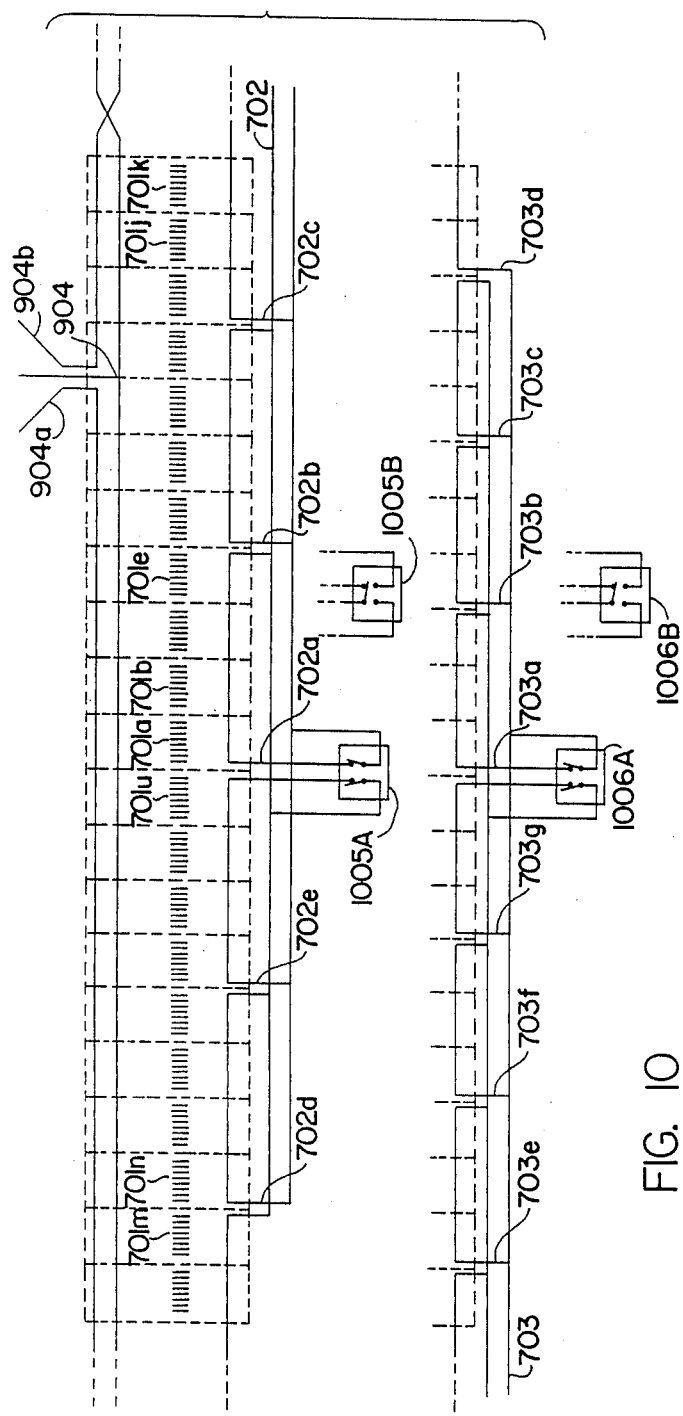
FIG. 10 is a schematic of a picture frame matrix transformer having two secondaries whose ratio can be varied by switching devices.

FIG. 10 is the transformer of FIG. 9, modified by the addition of two switching devices 1005 and 1006, each shown in their respective tWo operable states as 1005A and B and 1006A and B. The schematic drawing is shifted, but there is no physical change from the transformer of FIG. 9 except in the external connections at the switching devices 1005 and 1006.

With switching devices 1005 in state 1005A, and with switching devices 1006 in state 1006A, the transformer of FIG. 10 is connected exactly the same way as is the transformer of FIG. 9. Thus connected, the primary to secondary ratios are 1 to 1/5th for the first secondary 702, and 1 to 1/7th for the second secondary 703.

With switching devices 1005 in state 1005B, and with switching devices 1006 in state 1006B, the transformer ratio is altered. Thus connected, the primary to secondary ratios are 1 to 1/4th for the first secondary 702, and 1 to 1/6th for the second seoondary 703. Some caution is needed as the flux densities in the various cores 701a-u will be altered. A flux density analysis using the method introduced in the discussion of FIG. 7, should be done for every combination of switching devices operable states to determining which combinations, if any, of the switching states are not allowed.

Figure 11:
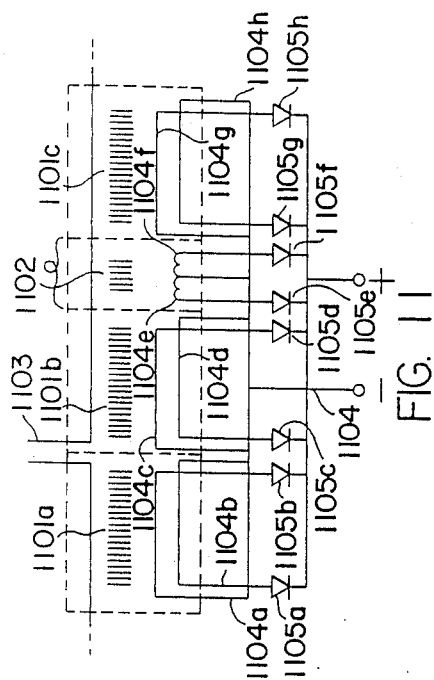
FIG. 11 is a schematic of a picture frame matrix transformer having a non-integer turns ratio, 1 to 3.14.

FIG. 11 teaches a method of constructing picture frame matrix transformers having non-integer turns ratios. A primary Winding 1103 makes a single turn through four cores, 1101a-c and 1102. A secondary winding 1104 comprises eight segments 1104a-h, each of which is half of a push pull winding. Six segments 1104a-d,g,h make a single pass through their elements. The other two segments, 1104e,f each has 7 turns. Each segment is terminated at ground (−) at one end, and goes through one of eight rectifiers 1105a-h to a positive bus (+) on the other end. As drawn, they are suitably arranged and polarized to be full wave rectified push pull windings. The special bracket like symbol above core 1102 indicates that this element is a side loop, and that core 1101b and 1101c are adjacent as explained below.

The primary to secondary ratio of the transformer of FIG. 11 is 1 to 3.14. This can be seen by analyzing either the current or the voltage relationships, as before. In each element, Lenz's law must apply so the primary ampere-turns equals the secondary ampere-turns. For three of the elements, there is a single primary and a single secondary turn (the push pull secondary has two wires, but they operate alternately as a single turn winding), so that the current in each of these three secondary winding segments equals the primary current. Added, the three currents add to equal three times the primary current. The fourth element has a single turn primary and a seven turn secondary. Thus the secondary current of that segment is 1/7th the primary current. Added to the other three, the total secondary current is 3 1/7th times the primary current, giving a 1 to 3.14 ratio.

Figure 12:
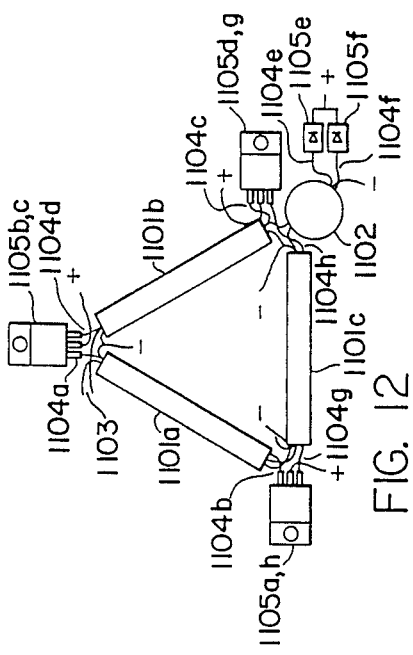
FIG. 12 is a diagram of the transformer of FIG. 11.

FIG. 12 shows a diagram of a possible physical arrangement for the transformer of FIG. 11. Note that the basic structure comprises three cores 1101a-c arranged in a closed pattern, a triangle. At each corner of the triangle there is a dual rectifier pack, comprising rectifiers 1105a-c,g,h. Thus the interconnections which are advantageous for high frequency operation are retained With balanced currents and very short lead lengths of the AC circuits. (Each output could also have an associated filter network). The last element is Wound in a different core 1102 because it can have lower flux capacity and is optimized for high frequency by simply pulling a loop off the primary winding 1103. Smaller rectifiers 1105e,f are suitable for these secondary windings 1104e,f. The output of the rectifiers 1105e,f is paralleled with the outputs of the other rectifiers 1105a-c,g,h. Because the four outputs are paralleled, they are constrained to have the same voltage. Because the element 1102 has seven turns, each 1/7th of the output voltage, Faraday's law shows that the primary voltage drop in this element will be 1/7th the drop of the other elements (neglecting diode drops and losses).

FIG. 13 shows a schematic of an inductor having parallel windings 1302 and 1303 wound around eight cores 1301a-h, it being understood that the inductor so represented is closed upon itself end-to-end, and the wires ending in dashed lines on the left are continued into the right, as illustrated in FIG. 8. The core symbol shows a "gap".

FIG. 14 shows a possible physical realization of the inductor of FIG. 13. The section A—A of FIG. 14A shows the air gap. Each of the windings 1302 and 1303 comprise six turns, Wound upon the cores 1301a-h. This is for background to introduce the concept of a picture frame matrix inductor, below. Given the physical parameters and the core characteristics, the inductance would be readily determined by one skilled in the art of inductor design.

FIG. 15 shows a schematic diagram of a picture frame matrix inductor, comprising eight cores 1501a-h with windings 1502a-h and 1503a-h. Each of the windings passes through six of the cores before exiting the inductor, as drawn.

FIG. 16 shows possible physical realization of the inductor of FIG. 15. Note that the section A—A of FIG. 16A is exactly the same as the section A—A of FIG. 14A. if each winding segment 1502a-h, 1503a-h carries the same current as the Winding segments 1302, 1303 of the transformer of FIG. 14, the magnetic parameters and characteristics are indistinguishable between the two inductors. This would also be readily apparent if one envisioned putting the winding segments 1502a-h and the winding segments 1503a-h in series. It is thus obvious to one skilled in the art that the inductor of FIG. 16, used with its windings paralleled, would have one eighth the inductance and eight times the current carrying capacity of the inductor of FIG. 14.

The inductor of FIG. 16 itself has no characteristic other than winding impedance which would make the currents in the several segments equal. However, if each was driven by the rectified output of a segment of a secondary of a picture frame matrix transformer, the currents would be equal.

FIG. 17 shows a picture frame matrix transformer circuit assembled in a modified pot core 1701. As is usual With pot cores, there is center post and an outer return path. The outer return path of the pot core 1701 is divided, in this case into eight sections by slots 1711a-h. These eight sections can be used in the manner of individual elements and wired as a picture frame matrix transformer. A primary winding 1702 comprising four straps 1702a-d is wired as a symmetrical push-pull primary. A secondary winding 1703 comprising sixteen straps 1703a-p is wired as eight parallel push-pull windings, each push-pull winding half coupling one element to give a picture frame matrix transformer having a one to eight ratio. Switching FET's 1704a,b and rectifiers 1705a-p are shown as an example of how external circuitry could be connected, the rectified outputs and the grounds, respectively, being connected in parallel.

The primary 1702 and the secondary 1703 of the picture frame matrix transformer of FIG. 17 are preferably comprised of wide, insulated copper straps, for low inductance and high current capacity. The ends of the straps could be made with pins extending downward for installation in a printed circuit board, and the exposed ends of the straps, fanned out somewhat, would be excellent heat sinking for the picture frame matrix transformer.

FIG. 18 is a schematic of a picture frame matrix transformer comprising seven cores 1801a-g, a primary winding 1802 making two complete passes through the cores 1801a-g, and a secondary winding comprising seven paralleled secondary winding segments 1803a-g. This teaches a method of achieving a higher ratio. The picture frame matrix transformer as shown has a ratio of two to 1/7th, or one to 1/14th (14 to 1).

Figure 19:
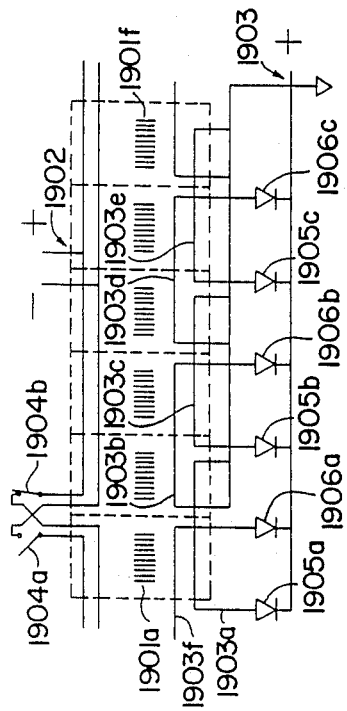
FIG. 19 is a schematic of a picture frame matrix transformer having a symmetrical push pull primary, and secondary windings in Which each secondary segment is a push pull Winding Which couples tWo elements on each side.

FIG. 19 is a schematic of a picture frame matrix transformer comprising six cores 1901a-f, a primary winding 1902 which is a symmetrical push pull winding, and a secondary winding 1903 comprising six secondary winding segments 1903a-f wired as three parallel push-pull windings. Switches 1904a,b provide the alternating primary excitation for transformer action, and rectifiers 1905a-c and 1906a-c provide a DC output. Each secondary segment makes a pass through two elements, so the ratio is 1 to 2/6, or 1 to 1/3, or 3 to 1. A unique feature of this circuit is that the rectifiers 1905a-c and 1906a-c are evenly spaced for easier layout and better heat spreading.

In the transformer of FIG. 19, the three rectifiers 1905a-c could be replaced with one rectifier. The anode potential of these three rectifiers is the same magnitude and phase so the anode connections could be paralleled prior to rectification. Similarly, the three rectifiers 1906a-c could be replaced with one rectifier. Low inductance interconnecting methods should be used for circuits carrying AC currents.

Figure 20:
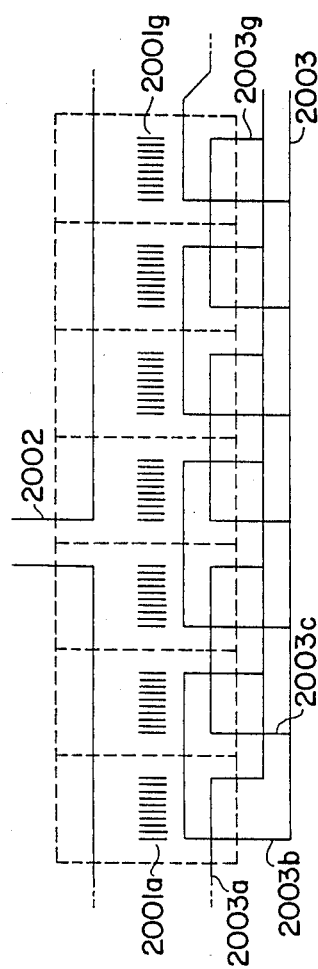
FIG. 20 is a schematic of a picture frame matrix transformer having a secondary in which each secondary segment couples two elements. There being an odd number of elements, two cycles are needed to close the pattern.

FIG. 20 is a schematic of a picture frame matrix transformer comprising seven cores 2001a-g, a primary winding 2002, comprising a single turn through the cores 2001a-g, and a secondary winding 2003, comprising seven secondary segments 2003a-g, each making a single pass through two cores. In as much as each of the seven secondary segments 2003a-g couples two cores, and there is an odd number of elements (cores 2001a-g, with their portion of the primary winding 2002 and portions of the secondary winding 2003), the pattern must be taken over two cycles to close upon itself without a gap or overlap. The ratio of this picture frame matrix transformer is 1 to 2/7th, or 3.5 to 1.

Figure 21:
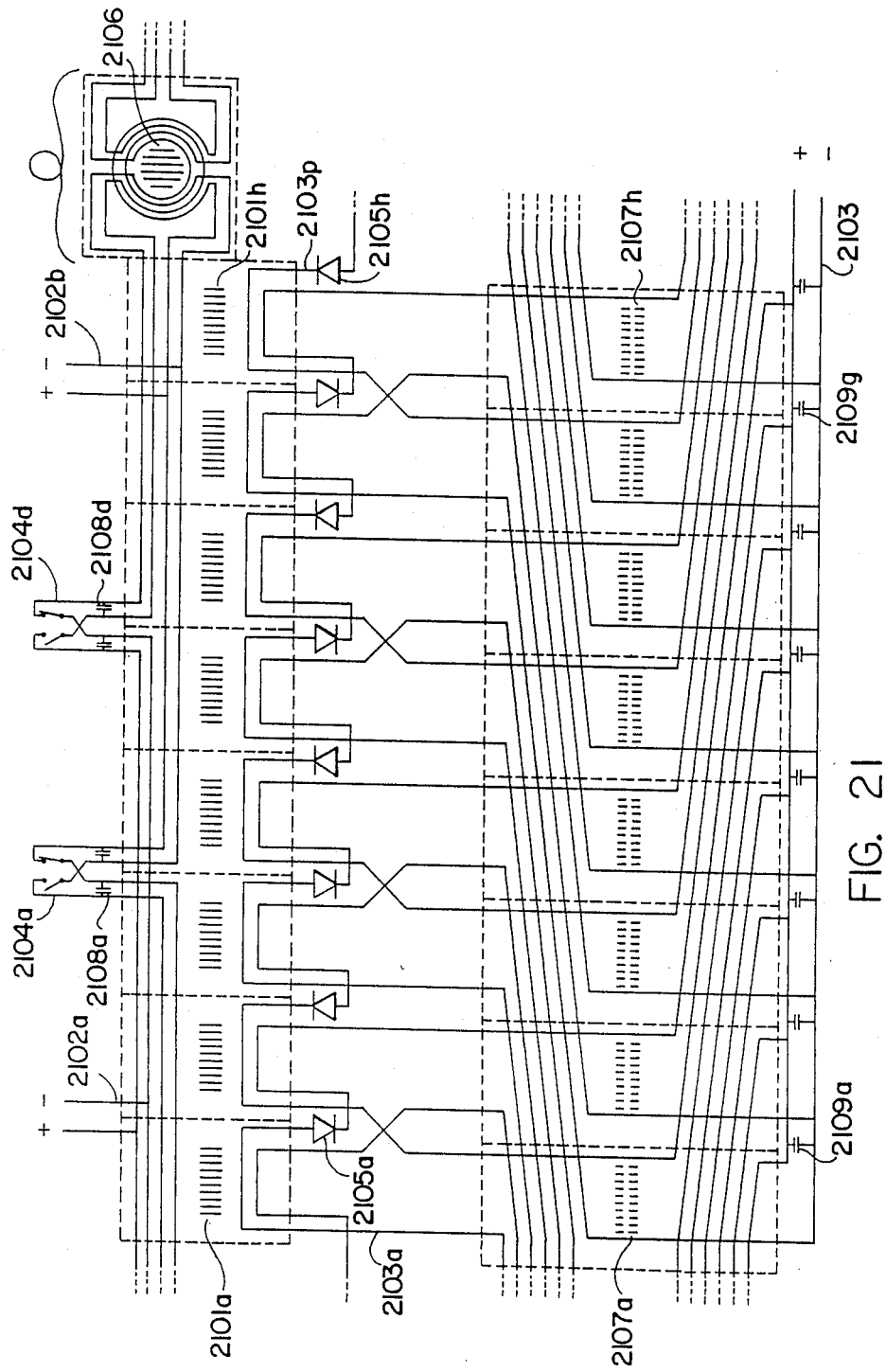
FIG. 21 shows a picture frame matrix transformer having parallel symmetrical push pull primary circuits with floating capacitors and a current balancing winding. The secondary output circuit includes rectifiers and a matrix inductor and capacitors as an output filter.

FIG. 21 is a schematic of a picture frame matrix transformer with a picture frame matrix inductor together with other circuit elements to make a functional circuit as might he employed for pulse width modulated power conversion. A transformer core comprising eight cores 2101a-h is wound with two primary windings 2102a,h. Each of the primary windings 2102a,b is a symmetrical push pull winding having switches 2104a-d to provide the alternating excitation needed for transformer operation. Each of the primary windings 2102a,h is also taken around a special core 2106, but in opposite direction for current balancing. This current balancing element, comprising the core 2106 and the portions of the two primary windings 2102a,b passing through it, is preferably a circular core such as a pot core and the portions of the primary passing through it are preferably loops pulled off the transformer primary windings 2102a,b so that the closed circuit of the transformer is not interrupted. The primary windings 2102a,b can be wired in parallel or in series for dual input voltage operation. If in series, the current balancing element is superfluous but harmless. In parallel, however, there would no be mechanism other than primary circuit impedances to force the currents to balance if the current balancing element were not used. The secondary winding 2103 comprises sixteen secondary segments 2103a-p wound as four symmetrical push pull secondaries, giving a transformer ratio of 1 to 2/8th, or 4 to 1. Rectifiers 2105a-h provide a DC output. A picture frame matrix inductor comprising eight cores 2107a-h is wired to the secondary 2103 of the picture frame matrix transformer. The windings of the picture frame matrix inductor are extensions of the secondary winding segments 2103a-h of the secondary winding 2103. Floating capacitors 2108a-d and output filter capacitors 2109a-h complete the circuit. Note that the rectifiers 2105a-h are each part of a series circuit comprising the rectifiers and two segments of the secondary 2103. Being a series circuit, the location of the rectifiers along the circuit is flexible which allow the designer many choices of layout.

Figure 22A:
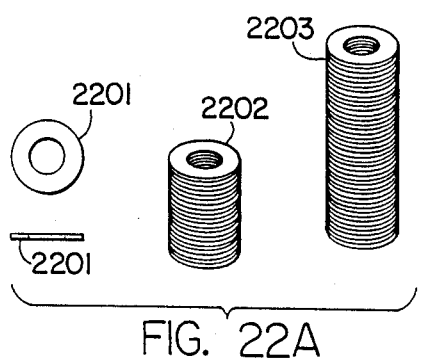
FIGS. 22A through 22D show laminations suitable for picture frame matrix transformers and inductors.
Figure 22B:
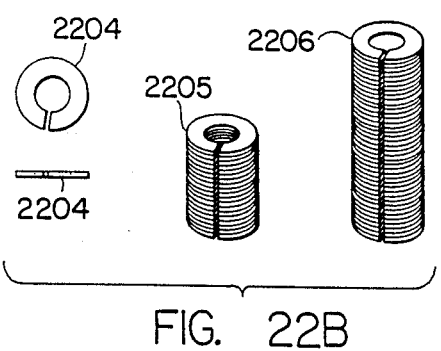
Figure 22C:
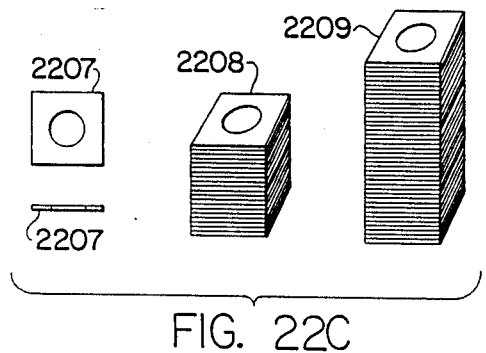
Figure 22D:
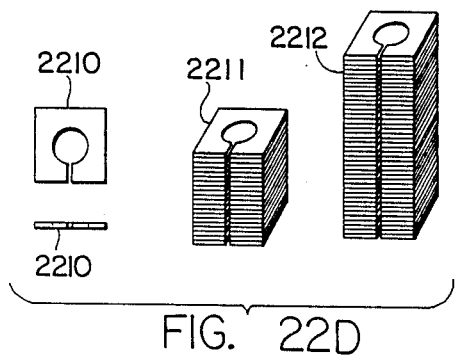

FIGS. 22A through 22D show laminations which would be suitable for picture frame matrix transformers or inductors of suitable frequency. For higher frequencies, the laminations are preferably thin and of higher resistivity material. Each FIG. 22A-D shows a variation on the same concept: that of using a stack of circular laminations. The quantity of laminations is easily varied to provide cores of similar flux path length but with different flux capacity as the particular picture frame matrix transformer or inductor core design requires. The radial laminations provide much better heat flow from the inside to the outer surface than a more usual tape wound core. FIGS. 22B and 22C show a slot to provide an air gap. FIGS. 22C and 22D show a square outside profile. The square profile has better thermal contact to a flat plate heat sink and has a slightly lower net flux density for the same outside dimensions. It might also make more efficient use of strip material in the fabrication process. A square hole is a possible variant.

FIG. 23A shows the component parts of a picture frame matrix transformer element assembly with progressive assembly shown in FIG. 23B and a portion of a picture frame matrix transformer using the same shown in FIG. 23C. Insulation between the conducting parts is necessary and is to be understood but has not been shown.

The assembly comprises two cores 2301a,b, a center conductor 2302 with three terminals 2302a-c, two outer conductors 2303a,b with a joining clip 2303c, and two end terminals 2303d,e.

To assemble the element assembly, a first terminal 2302b is fixed to the center of the center conductor 2302, as by soldering or brazing. With suitable insulation (not shown) or spacing, two outer conductors 2303a,b are slipped over the center conductor 2302 with the first terminal 2302a. Connecting clip 2303c is fixed to the outer conductors 2303a,b as by soldering to join them, and help locate them in place. Two cores 2301a,b are slipped over the outer conductors. The end terminals 2303d,e of the outer conductors are then fixed to the outer conductors, as by rolling and soldering, and, with suitable insulation, (not shown) or spacing, the second and third terminals 2302a,c are fixed to the center conductor tube 2301, as by rolling and soldering.

The whole, when assembled and designated 2304, is suitable as a component part of a picture frame matrix transformer, such as in the portion of a picture frame matrix transformer shoWn in FIG. 23C. Two element assemblies, 2304b,c, and parts of two other assemblies 2304a,d, broken to show the primary 2305 and to indicate that the element assemblies 2304a–d are a portion of a larger assembly, are incorporated into a picture frame matrix transformer. The conducting parts of the element assemblies 2304a–d comprise part of the secondary circuit of the picture frame matrix transformer and are coaxial to the primary winding 2305, which itself is a coaxial winding, as shown, having an inner conductor 2305a, and an outer conductor 2305b.

A less expensive, but functionally equivalent part could be made of formed flat stock without much compromise.

The coaxial configuration, and in particular the symmetrical push pull coaxial configuration, is preferred for higher frequency operation.

FIG. 24A is a schematic of the portion of a picture frame transformer as shown in FIG. 23C.

FIG. 24B is the same as FIG. 24A except for the addition of rectifiers 2406a–f. Note that in each instance, the anode of the rectifier connects to the outer conductor and the cathode connects to the inner conductor. This symmetry could he exploited in developing a practical design.

FIG. 24C employs the same portion of a picture frame matrix transformer as before, but only two rectifiers 2407a,b are used. Busses 2402a–c and 2403a–c provide the interconnections. This is possible because each secondary segment is part of a paralleled secondary. Thus the terminal voltage is constrained to be equal, and it follows that the voltage and phase at corresponding nodes will also be equal. These interconnections must have low inductance as they carry AC currents and could be planes in a multilayer printed circuit board.

Figure 25:
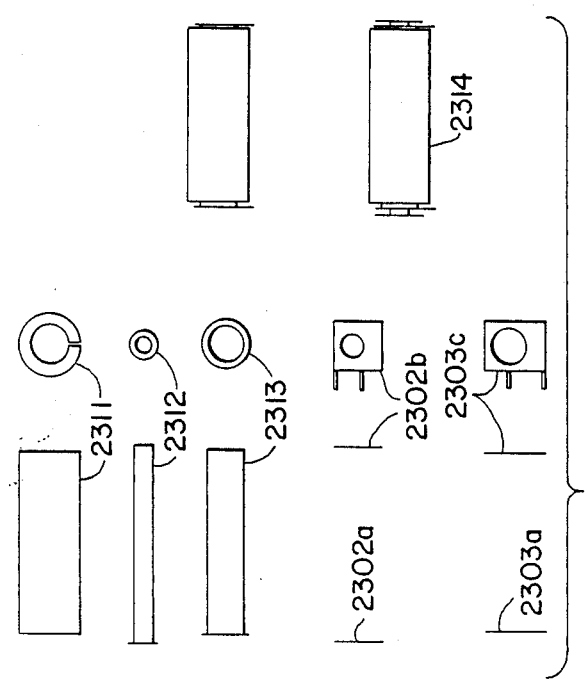
FIG. 25 shows the assembly of part of a picture frame inductor.

FIG. 25 shows the component parts and assembly 2314 of a two conductor element similar to the push-pull element of FIG. 23. A gapped core 2311 is shown as an illustration of another embodiment and not as a limitation but suggesting its use for an inductor or flyback transformer.

Figure 26:
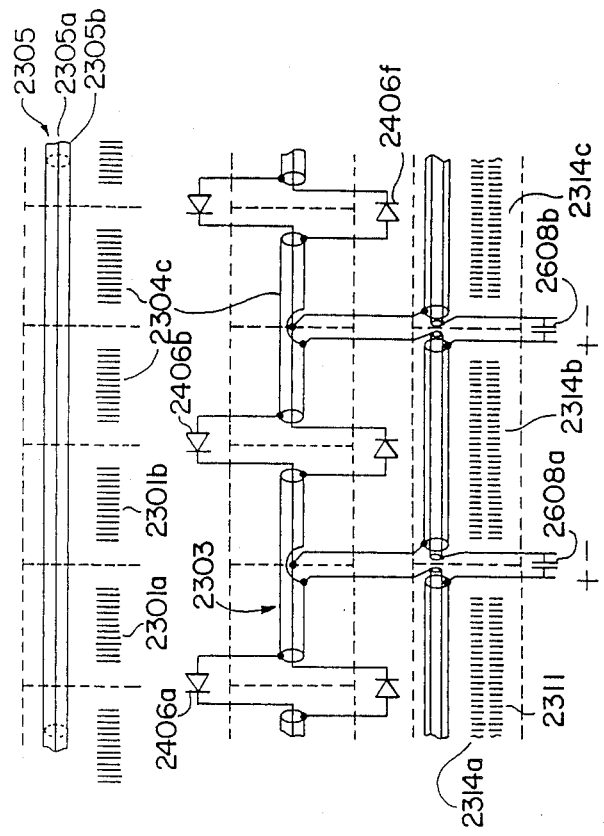
FIG. 26 shows a partial schematic example using the assemblies of FIG. 23 and 25.

FIG. 26 shoWs a schematic of picture frame matrix transformer similar to the transformer of FIG. 24B with the addition of output L-C filters comprising inductors 14a–c and capacitors 2608 a,b.

Figure 27:
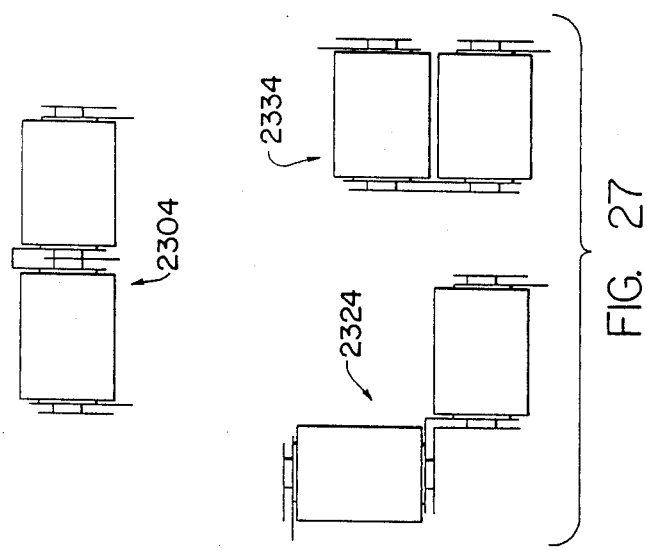
FIG. 27 shows variants of the assembly of FIG. 23, for a corner and for a "U" turn.

FIG. 27 shows element assemblies, 2324 and 2334 which are similar to the element assembly 2304 of FIG. 23, except they are designed to be at a right angle or as a "U" turn, respectively.

Figure 28:
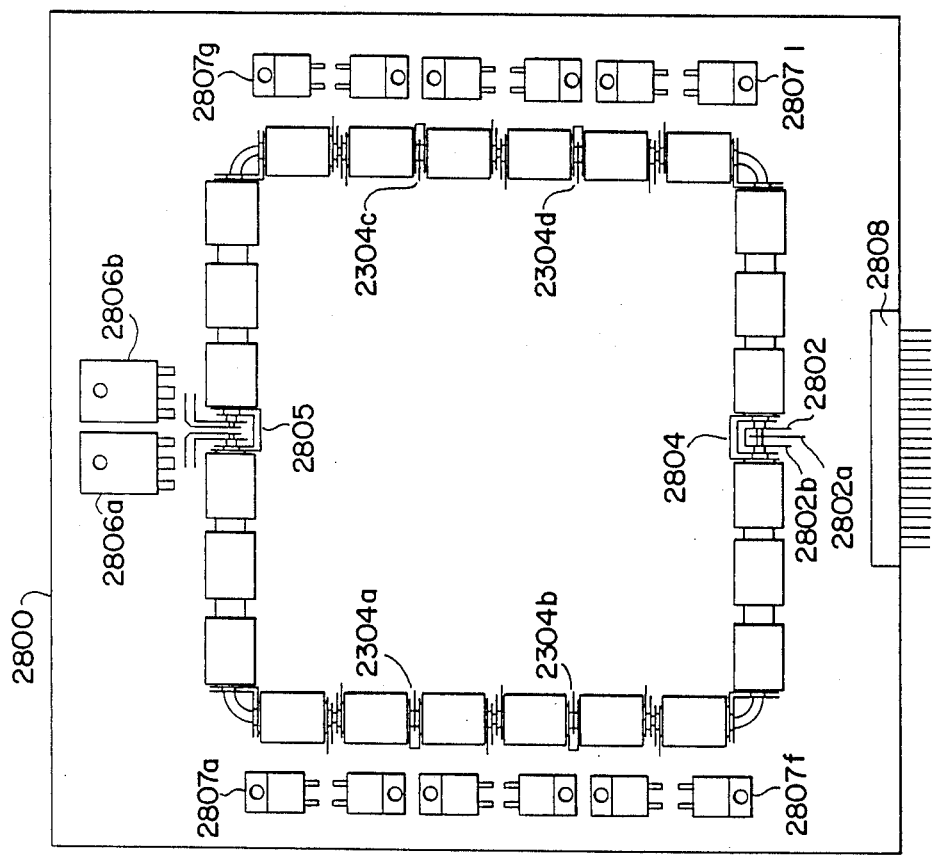
FIG. 28 shows a picture frame matrix transformer With its switching FET's and rectifiers as it might be assembled on printed circuit card.

FIG. 28 shows a possible finished assembly of a picture frame matrix transformer mounted on a printed circuit board 2800. The transformer comprises four assemblies 2304a–d similar to the assembly of FIG. 23B and two special assemblies 2804 and 2805, together providing the cores and the secondary windings. A primary winding 2802, which is a coaxial symmetrical push pull winding comprising an inner conductor 2802a and an outer conductor 2802b is terminated in the two special assemblies 2804,2805. The first special assembly 2804 provides some of the cores, a segment of the secondary winding, and the supply termination for the primary winding 2802. The second special assembly 2805 provides the termination for the primary 2802 at switching FET's 2806a,b. Rectifiers 2807a–l provide a DC output. A connector 2808 terminates the assembly.

Note that the two sPecial assemblies 2804,2805 each have extra cores, one to Provide free area around the connector 2808 and the other to provide free area around the switching FET's 2806a,b. As discussed in the discussion of FIG. 4, these extra cores do not affect the transformer ratio. The flux density will be lower in these cores (if all are of equal size and similar material) so heat flux is also lower.

Figure 29:
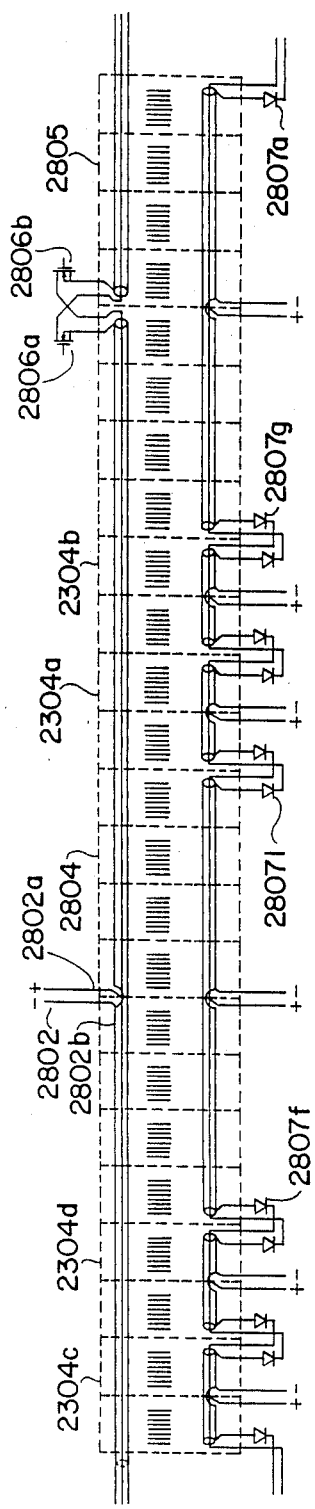
FIG. 29 schematic of the transformer of FIG. 28.

FIG. 29 is the schematic for the transformer assembly of FIG. 28 and shoWs the interwiring of the parts.

FIG. 30 shows another illustrative circuit card layout showing alternate embodiments of the invention. It is in many respects similar to the circuit of FIG. 28 and only the differences Will be discussed. Additional parts are shown those being the Picture frame inductor elements 2314a–j, and the floating capacitors 3009a,b. Corner secondary elements 2324a–d are used. The primary winding 3002 is terminated at a corner and the symmetrical switching FET's 3006a,b are in the opposite corner. This arrangement takes advantage of the openness of the corner and allows higher dielectric insulation and greater creepage distance.

Figure 31:
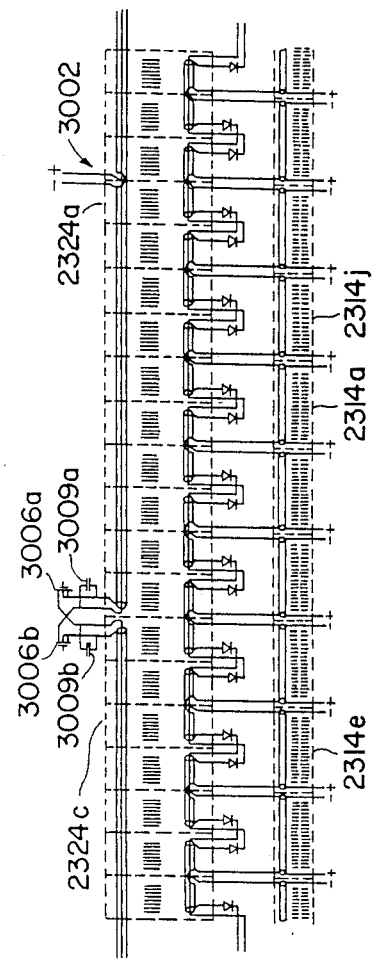
FIG. 31 is a schematic of the transformer and inductor of FIG. 30.

FIG. 31 is the schematic for the transformer assembly of FIG. 30.

Figure 32:
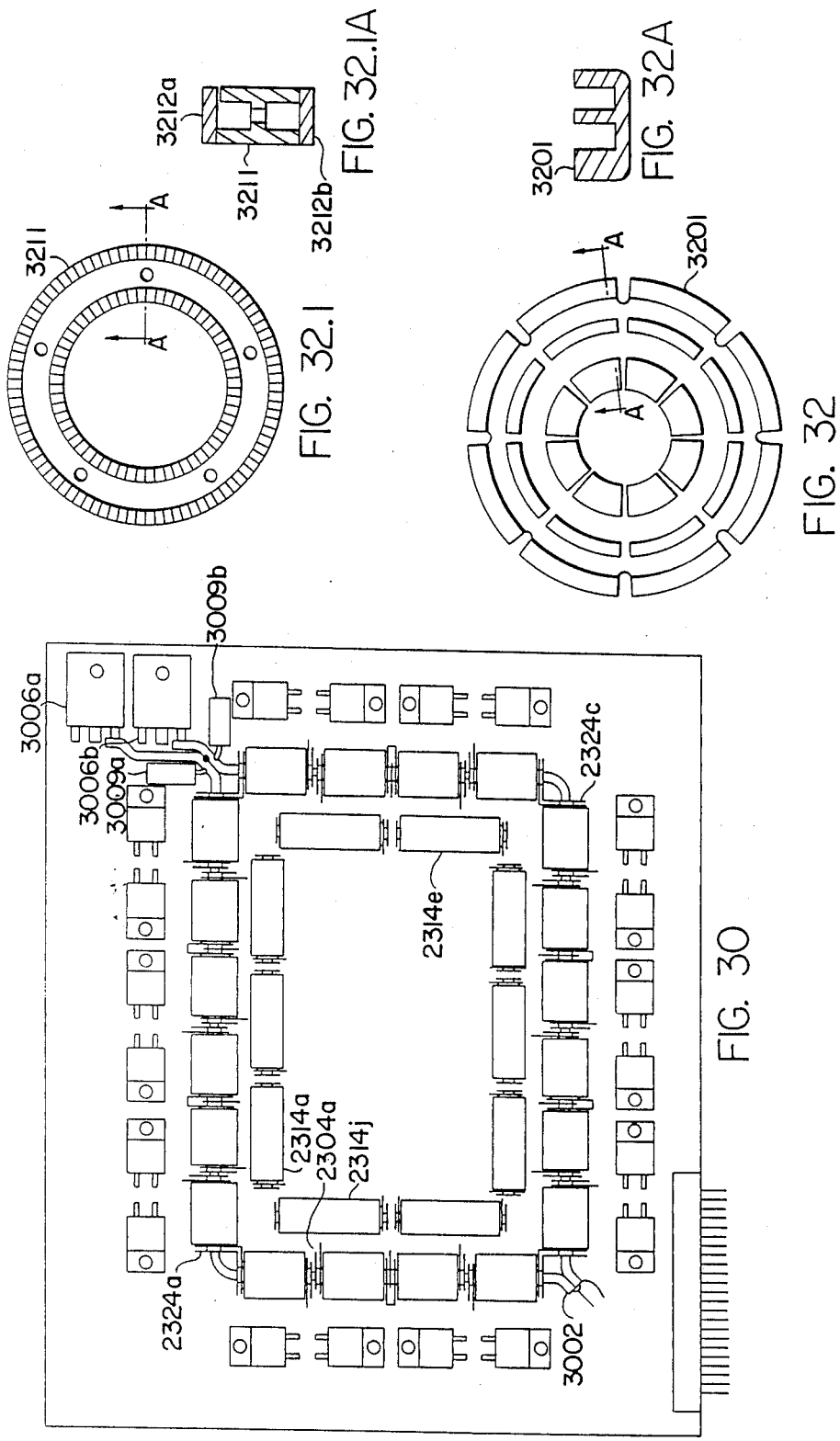

FIG. 32 shows a core structure 3201 which would be suitable for a matrix transformer and a matrix inductor combined into one assembly. Either the outer or inner pattern could be the inductor. A similar mating part or a flat cover would complete the magnetic return path. A gap can be provided in the inductor path which is not common to the transformer.

FIG. 32.1 shows another core structure 3211 which would be suitable for a matrix transformer and a matrix inductor combined into one assembly. Alternatively, both sections could be used for the transformer. A flat cover 3212a,b on each side would complete the magnetic return path.

FIG. 33 shows special core parts 3301 a,b,y,z 3311a,b and 3321 which would be suitable for making a picture frame matrix transformer in Which the windings were part of a printed wiring assembly. Note that the wire runs 3312a–d enter and exit the transformer at the sides of the cores relative to the length of the transformer. This is done so that there is only a very small gap where the cores meet end to end, and so there is a closed flux path around the point of entrance or exit. This closed flux path would tend to resist unbalanced currents such as capacitively coupled noise currents or circuit imbalances. Taking runs off between the ends of successive cores would leave excessive open area Where the Winding would not be coupled within a magnetic return path.

FIGS. 33A and 8 show sections A—A and B—B, respectively.

FIG. 34 shows the addition of small toroids 3401a-g to the picture frame matrix transformer of FIG. 1. Any unbalanced currents in the windings at the points of entrance/exit would be resisted by these toroids 3401a-g.

FIG. 35 shows special cores 3501a-g added to the transformer of FIG. 1. These cores serve the same function as the toroids 3401a-g in FIG. 34, but they also contribute to the flux capacity of the transformer as a whole.

FIGS. 35A and B show a section and a side view respectively of the special core 3501.

FIG. 36 shows a transformer using special cores 3601 a-j. These cores 3601a-j are essentially long slender toroids having side holes 3611a-j especially for the interconnections. While somewhat harder to fabricate, these cores offer the advantages of a more closed structure around the winding and a closed flux path around each of the side holes 3611a-j which effectively resists any uncoupled currents.

FIG. 37 and FIGS. 37A and B show an end view and two sections A—A and B—B of the special core 3601.

We claim:

1. A picture frame matrix transformer, comprising:
a plurality of interdependent magnetic elements;
at least one plurality winding comprising an electrical conductor; each conductor having first and second ends;
at least one secondary winding comprising an electrical conductor, each conductor having first and second ends;
each of said plurality of interdependent magnetic elements being arranged end-to-end with an immediately adjacent magnetic element in a closed pattern configuration;
one of said at least one primary winding and one secondary winding passing at least once through each of said plurality of interdependent magnetic elements, one of said first and second ends of one of said at least one primary and secondary winding ending at an end-to-end position between adjacent magnetic elements where the other of said first and second ends of another of said at least one primary and secondary winding begins;
each of said plurality of magnetic elements further having at least one turn of the other of at least one primary and secondary windings with the winding being associated one-for-one with said plurality of magnetic elements, one of said first and second ends of said winding associated with one magnetic element ending at the end-to-end position between magnetic elements where one of said first and second ends of a winding associated with an adjacent magnetic elements begins, said ending of one winding and the beginning of an adjacent winding at an end-to-end position between magnetic elements being repeated for each of said end-to-end positions.

2. A picture frame matrix transformer as defined in claim 1 wherein said interdependent magnetic elements comprise cylindrically shaped cores having a diameter dimension substantially smaller than its longitudinal dimension.

3. A picture frame matrix transformer as defined in claim 2 wherein each of said cores further comprise a number of core segments wherein the total flux capacity of said number of core segments is sufficient to support the volts-seconds of a primary winding voltage signal.

4. A picture frame matrix transformer as defined in claim 3 having N core segments, a one turn primary winding, and a plurality of secondary windings, each of said plurality of secondary windings passing through one of said N core segments and each having their respective first and second ends connected together such that said secondary windings are in parallel whereby a matrix transformer having a transformation ratio of 1 to N is made.

5. A picture frame matrix transformer as defined in claim 4 wherein said N core segments are of unequal longitudinal lengths, the length of the shortest core segment being no shorter than that length required for a core segment to have sufficient flux capacity to support 1/N volts-seconds of a primary winding voltage signal.

6. A picture frame matrix transformer as defined in claim 4 wherein N is an integer.

7. A picture frame matrix transformer as defined in claim 4 further comprisinq at least one of said plurality of secondary windings having a first number of turns (X) and forming a first secondary circuit and at least one of other of said plurality of secondary windings having a second number of turn (Y) and forming a second secondary circuit, said first and second secondary circuits having different numbers of turns Whereby the magnitude of current flowing in said first secondary circuit is 1/X of the current Ip flowing in said primary circuit and the magnitude of current flowing in said secondary circuit is 1/Y of the current Ip flowing in said primary circuit.

8. A picture frame matrix transformer as defined in claim 7 further comprising a first number (A) of first secondary circuits and a second number (B) of second secondary circuits wherein the sum of A+B=N, said first and second secondary circuits being connected in parallel and the total secondary current is Is $= A(1/X\ Ip) + B(1/Y\ Ip)$ whereby the transformation ratio of the matrix transformer is 1 to $[A(1/X) + B(1/Y)]$.

9. A picture frame matrix transformer as defined in claim 3 having N core segments, a plurality of primary windings and a plurality of secondary windings, each of said plurality of primary windings passing through P core segments and each having their respective first and second ends connected together such that said primary windings are in parallel, each of said plurality of secondary windings passing through S core segments and each having their respective first and second ends connected together such that said secondary windings are in parallel whereby a matrix transformer having a transformation ratio of P to S is made.

10. A picture frame matrix transformer as defined in claim 3 wherein said at least one secondary winding is a push-pull winding.

11. A picture frame matrix transformer as defined in claim 3 wherein said at least one primary winding is a push-pull winding.

12. A picture frame matrix transformer as defined in claim 1 wherein said plurality of interdependent magnetic elements further comprise a closed unitary structure having an interior channel for carrying said primary and secondary windings, said structure further including a number of spaced apart openings in registration with said channel and through which the ends of said windings pass, said end of one winding and the beginning of an adjacent winding passing through one of said number of spaced apart openings and said end of a different one winding and the beginning of a different adjacent winding passing through another of said number of spaced apart openings.

13. A picture frame matrix transformer as defined in claim 1 wherein said interdependent magnetic elements comprise axially elongated magnetic cores having a cross sectional dimension substantially smaller than its longitudinal dimension, each of said magnetic cores further comprising a number of core segments wherein the total flux capacity of said number of core segments is sufficient to support the volts secondary of a primary winding voltage signal.

14. A picture frame matrix transformer as defined in claim 13 wherein said at least one secondary winding comprises a plurality of push-pull winding segments, each push-pull winding segment including at least two electrical conductors, and each of said at least two conductors having first and second ends, one of said first and second ends of each of said at least two electrical conductors being connected and forming a first connection point between two adjacent magnetic cores and one of said at least two electrical conductors passing through one of said two adjacent magnetic cores and having its unconnected end forming a second connection point between said one adjacent magnetic tore and a next adjacent magnetic core, the other of said at least two conductors passing through the other of said two adjacent magnetic cores and having its unconnected end forming a third connection point between said one adjacent magnetic core and an immediately preceding adjacent magnetic core.

15. A picture frame matrix transformer as defined in claim 14 wherein said at least two electrical conductors forming a push-pull winding segment comprises a centertapped single electrical conductors.

16. A picture frame matrix transformer as defined in claim 1 wherein said interdependent magnetic elements comprise axially elongated magnetic cores having a cross sectional dimension substantially smaller than its longitudinal dimension.

17. A picture frame matrix transformer, comprising:
a plurality of interdependent magnetic elements;
at least one primary winding comprising an electrical conductor, each having first and second ends;
at least one secondary winding comprising an electrical conductor, each having first and second ends;
each of said plurality of interdependent magnetic elements being arranged end-to-end with an immediately adjacent magnetic element in a closed pattern configuration;
one of said at least one primary winding and one secondary winding passing at least once through each of said plurality of interdependent magnetic elements, one of said first and second ends ending at an end-to-end position between adjacent magnetic elements where the other of said first and second ends begins;
each of said plurality of magnetic elements further having at least one turn of the other of said at least one primary and secondary windings with the winding being associated one-for-one with said plurality of magnetic elements, one of said first and second ends of said winding associated with one magnetic element ending at the end-to-end position between magnetic elements where one of said first and second ends of a winding associated with an adjacent magnetic element begins, said ending of one winding and the beginning of an adjacent winding at an end-to-end position between magnetic elements being repeated for each of said end-to-end positions;
said interdependent magnetic elements further comprising cylindrically shaped cores having a diameter dimension substantially smaller than its longitudinal dimension, and
each of said cores further comprising a number of core segments wherein the total flux capacity of said number of core segments is sufficient to support the volts-seconds of a primary winding voltage signal.

* * * * *

UNITED STATES PATENT AND TRADEMARK OFFICE
CERTIFICATE OF CORRECTION

PATENT NO.  : 4,978,906
DATED       : December 18, 1990
INVENTOR(S) : Edward Herbert, et al.

It is certified that error appears in the above-identified patent and that said Letters Patent is hereby corrected as shown below:

Column 16, line 27, delete "Whereby" and substitute --whereby--.

Column 17, line 25, delete "tore" and substitute --core--.

Signed and Sealed this

Twelfth Day of May, 1992

Attest:

DOUGLAS B. COMER

Attesting Officer

Acting Commissioner of Patents and Trademarks